US009609751B2

(12) United States Patent
Jomaa et al.

(10) Patent No.: US 9,609,751 B2
(45) Date of Patent: Mar. 28, 2017

(54) PACKAGE SUBSTRATE COMPRISING SURFACE INTERCONNECT AND CAVITY COMPRISING ELECTROLESS FILL

(71) Applicant: QUALCOMM Incorporated, San Diego, CA (US)

(72) Inventors: Houssam Wafic Jomaa, San Diego, CA (US); Omar James Bchir, San Marcos, CA (US); Chin-Kwan Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 69 days.

(21) Appl. No.: 14/251,486

(22) Filed: Apr. 11, 2014

(65) Prior Publication Data
US 2015/0296616 A1    Oct. 15, 2015

(51) Int. Cl.
*H05K 1/11*    (2006.01)
*H05K 1/02*    (2006.01)
(Continued)

(52) U.S. Cl.
CPC ........ *H05K 1/112* (2013.01); *H01L 23/49822* (2013.01); *H05K 1/0298* (2013.01); *H05K 3/422* (2013.01); *H05K 3/425* (2013.01); *H05K 3/429* (2013.01); *H01L 23/49827* (2013.01); *H01L 2224/16225* (2013.01); *H01L 2924/15311* (2013.01); *H05K 2201/0344* (2013.01);
(Continued)

(58) Field of Classification Search
CPC ... H05K 1/03; H05K 1/11; H05K 1/14; H05K 3/10; H05K 3/18; H05K 3/30; H05K 3/40; H01L 21/02; H01L 21/47; H01L 21/70; H01L 21/98; H01L 23/16; H01L 23/24; H01L 23/48; H01L 23/52; H01L 23/58; B32B 37/00
USPC .......... 174/261, 254–256; 361/795; 257/635, 257/774, 775, 777; 430/319, 324
See application file for complete search history.

(56) References Cited

U.S. PATENT DOCUMENTS 3,965,277 A * 6/1976 Guditz .................... H01L 23/52
                                          156/300
4,150,177 A * 4/1979 Guditz ................ H01L 21/4846
                                          205/187
(Continued)

OTHER PUBLICATIONS

International Search Report and Written Opinion—PCT/US2015/025150—ISA/EPO—Jul. 23, 2015.

*Primary Examiner* — Xiaoliang Chen
(74) *Attorney, Agent, or Firm* — Loza & Loza, LLP

(57) ABSTRACT

Some novel features pertain to a substrate that includes a first dielectric layer, a first interconnect, a first cavity, and a first electroless metal layer. The first dielectric layer includes a first surface and a second surface. The first interconnect is on the first surface of the substrate layer. The first cavity traverses the first surface of the first dielectric layer. The first electroless metal layer is formed at least partially in the first cavity. The first electroless metal layer defines a second interconnect embedded in the first dielectric layer. In some implementations, the substrate further includes a core layer. The core layer includes a first surface and a second surface. The first surface of the core layer is coupled to the second surface of the first dielectric layer. In some implementations, the substrate further includes a second dielectric layer.

16 Claims, 15 Drawing Sheets

(51) Int. Cl.
*H05K 3/42* (2006.01)
*H01L 23/498* (2006.01)

(52) U.S. Cl.
CPC .............. *H05K 2201/09036* (2013.01); *H05K 2201/10378* (2013.01)

(56) References Cited

U.S. PATENT DOCUMENTS

| | | | |
|---|---|---|---|
| 4,372,996 A * | 2/1983 | Guditz | C23C 18/31 106/1.29 |
| 5,945,741 A * | 8/1999 | Ohsawa | H01L 23/24 257/666 |
| 6,259,162 B1 | 7/2001 | Ma et al. | |
| 7,649,749 B2 * | 1/2010 | Tsukano | H01L 21/4846 174/254 |
| 7,795,150 B2 | 9/2010 | Chan et al. | |
| 7,911,037 B1 * | 3/2011 | Huemoeller | H01L 21/4846 174/255 |
| 8,169,071 B2 | 5/2012 | Jang et al. | |
| 8,492,197 B2 | 7/2013 | Cho et al. | |
| 8,772,951 B1 * | 7/2014 | Kim | H01L 23/498 257/774 |
| 8,942,004 B2 * | 1/2015 | Hong | H01L 23/5389 174/262 |
| 2006/0273816 A1 * | 12/2006 | Hsu | G01R 1/0483 174/255 |
| 2008/0029894 A1 * | 2/2008 | Wang | H01L 23/49822 257/762 |
| 2008/0041621 A1 * | 2/2008 | Hsu | H05K 3/465 174/262 |
| 2008/0052904 A1 * | 3/2008 | Schneider | H01L 21/486 29/846 |
| 2010/0009554 A1 | 1/2010 | Ryu et al. | |
| 2010/0059866 A1 | 3/2010 | Jang et al. | |
| 2010/0147560 A1 | 6/2010 | Kaneko | |
| 2010/0288549 A1 * | 11/2010 | Chiang | H01L 21/4857 174/261 |
| 2010/0319966 A1 * | 12/2010 | Liu | H05K 13/00 174/255 |
| 2011/0056739 A1 * | 3/2011 | Lee | H05K 3/4644 174/262 |
| 2011/0154658 A1 * | 6/2011 | Chuang | H05K 3/0097 29/829 |
| 2011/0232085 A1 * | 9/2011 | Muramatsu | H05K 3/0032 29/852 |
| 2011/0284277 A1 * | 11/2011 | Kato | H05K 1/113 174/258 |
| 2012/0153501 A1 * | 6/2012 | Murai | H01L 23/14 257/774 |
| 2015/0048515 A1 * | 2/2015 | Zhang | H01L 23/5381 257/774 |

* cited by examiner

PLAN VIEW

PACKAGE SUBSTRATE COMPRISING SURFACE INTERCONNECT AND CAVITY COMPRISING ELECTROLESS FILL

BACKGROUND

Field

Various features relate to a package substrate comprising a surface interconnect and a trench comprising electroless fill.

Background

FIG. 1 illustrates a conventional integrated package 100 that includes a substrate 102, a set of interconnects 104, a first die 106, a second die 108, a first set of die to package interconnects 116, a second set of die to package interconnects 118, and a third set of solder balls 120. The third set of solder balls 120 is for a substrate to motherboard interconnect. The first set of die to package interconnects 116 and/or the second set of solder balls 118 may be solder balls. The set of interconnects 104 includes traces, which are located inside the substrate 102. The first die 106 is coupled to the substrate 102 through the first set of interconnects 116. The second die 108 is coupled to the substrate 102 through the second set of interconnects 118. The third set of solder balls 120 is coupled to the substrate 102. The first die 106 and the second die 108 are coupled to the third set of solder balls 120 through the set of interconnects 104 in the substrate 102. Typically, the third set of solder balls 120 is coupled to a printed circuit board (PCB) (not shown).

Conventional integrated packages, such as the one described in FIG. 1, have certain limitations and downsides. For example, conventional integrated packages are limited by the routing density and can be costly to fabricate. There is a need to provide integrated devices that are cheaper to produce, as well as having better (e.g., higher) routing density characteristics. Therefore, there is a need for a cost effective integrated package that has a low profile but also takes up a little real estate as possible. Ideally, such an integrated package will also provide higher density connections with the dies.

SUMMARY

Various features, apparatus and methods described herein provide a package substrate.

A first example provides a substrate that includes a first dielectric layer, a first interconnect, a first cavity, and a first electroless metal layer. The first dielectric layer includes a first surface and a second surface. The first interconnect is on the first surface of the substrate layer. The first cavity traverses the first surface of the first dielectric layer. The first electroless metal layer is formed in the first cavity. The first electroless metal layer defines a second interconnect embedded in the first dielectric layer.

According to an aspect, the substrate includes a second cavity traversing the first surface of the first dielectric layer, and a second electroless metal layer formed in the second cavity, wherein the second electroless metal layer defines a third interconnect embedded in the first dielectric layer.

According to one aspect, the substrate includes a first pad on the first surface of the first dielectric layer, a first via traversing the first dielectric layer, the first via coupled to the first pad, and a second pad embedded in the first dielectric layer, where the second embedded through the second surface of the first dielectric layer, wherein the second pad is coupled to the first via.

According to an aspect, the substrate includes a core layer comprising a first surface and a second surface, where the first surface of the core layer is coupled to the second surface of the first dielectric layer. In some implementations, the core layer includes a first via. In some implementations, the substrate includes a second dielectric layer comprising a first surface and a second surface, where the first surface of the second dielectric layer is coupled to the second surface of the core layer.

According to one aspect, the substrate includes a third interconnect embedded in the first surface of the first dielectric layer, where the third interconnect comprising an electroless metal layer, and a first pad on the first surface of the first dielectric layer, where the first pad coupled to the third interconnect.

According to an aspect, the substrate includes a resist layer on the first dielectric layer.

According to one aspect, the substrate is one of at least a package substrate and/or an interposer.

According to an aspect, the substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes a first dielectric layer comprising a first surface and a second surface, a first interconnect means on the first surface of the substrate layer, a first cavity traversing the first surface of the first dielectric layer, and a first electroless interconnect means formed at least partially in the first cavity.

According to an aspect, the apparatus includes a second cavity traversing the first surface of the first dielectric layer, and a second electroless interconnect means is formed at least partially in the second cavity.

According to one aspect, the apparatus includes a first pad on the first surface of the first dielectric layer, a first vertical interconnect means traversing the first dielectric layer, the first vertical interconnect means is coupled to the first pad, and a second pad embedded in the first dielectric layer, the second embedded through the second surface of the first dielectric layer, wherein the second pad is coupled to the first vertical interconnect means.

According to an aspect, the apparatus includes a core layer comprising a first surface and a second surface, where the first surface of the core layer is coupled to the second surface of the first dielectric layer. In some implementations, the core layer includes a first vertical interconnect means. In some implementations, the apparatus includes a second dielectric layer comprising a first surface and a second surface, where the first surface of the second dielectric layer is coupled to the second surface of the core layer.

According to one aspect, the apparatus includes a third electroless interconnect means embedded in the first surface of the first dielectric layer, and a first pad on the first surface of the first dielectric layer, the first pad coupled to the third electroless interconnect means.

According to an aspect, the apparatus includes a resist layer on the first dielectric layer.

According to one aspect, the apparatus is one of at least a substrate and/or an interposer.

According to an aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for fabricating a substrate. The method forms a first dielectric layer comprising a first surface and a second surface. The method forms a first interconnect on the first surface of the substrate layer. The method forms a first cavity that traverses the first surface of the first dielectric layer. The method forms a first electroless metal at least partially in the first cavity, where the first electroless metal defines a second interconnect embedded in the first dielectric layer.

According to an aspect, the method forms a second cavity that traverses the first surface of the first dielectric layer. The method forms a second electroless metal at least partially in the second cavity, where the second electroless metal defines a third interconnect embedded in the first dielectric layer.

According to one aspect, the method forms a first pad on the first surface of the first dielectric layer. The method forms a first via that traverses the first dielectric layer, the first via coupled to the first pad. The method forms a second pad embedded in the first dielectric layer. The second pad embedded through the second surface of the first dielectric layer, where the second pad is coupled to the first via.

According to an aspect, the method forms a core layer comprising a first surface and a second surface, wherein the first surface of the core layer is formed on the second surface of the first dielectric layer. In some implementations, the core layer comprises a first via. In some implementations, the method forms a second dielectric layer comprising a first surface and a second surface, wherein the first surface of the second dielectric layer is formed on the second surface of the core layer.

According to one aspect, the method forms a third interconnect embedded in the first surface of the first dielectric layer, the third interconnect comprising an electroless metal layer. The method forms a first pad on the first surface of the first dielectric layer, where the first pad coupled to the third interconnect.

According to an aspect, the method forms a resist layer on the first dielectric layer.

According to one aspect, the substrate is one of at least a package substrate and/or an interposer.

According to an aspect, substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

FIG. 8 (comprising FIG. 8A, FIG. 8B, and FIG. 8C) illustrates an exemplary sequence for providing/fabricating a substrate that includes an embedded trench with selective electroless copper fill in the trench and semi additive process formed traces on the surface of the dielectric layer.

Figure 9:
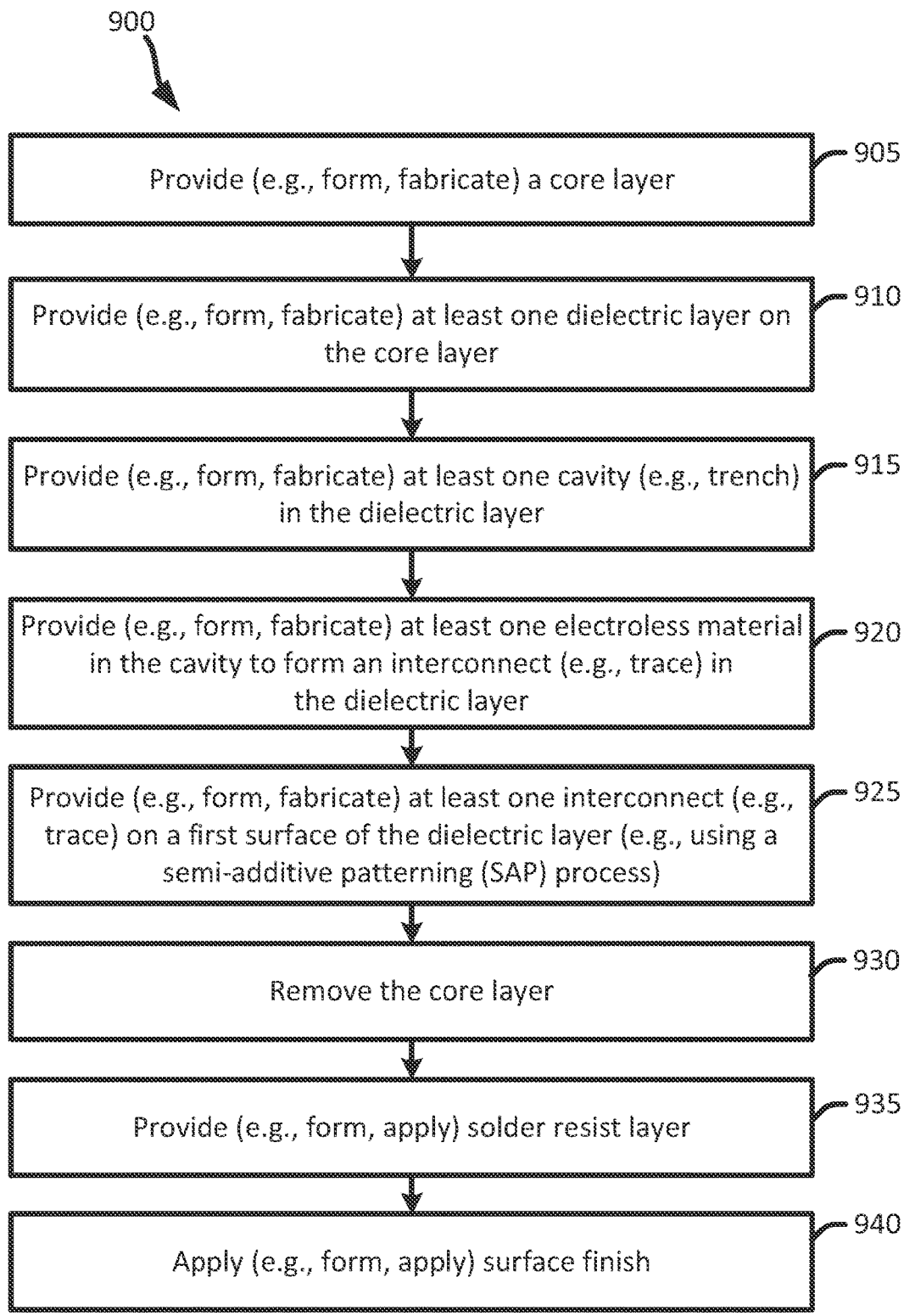

FIG. 9 illustrates a flow diagram of a method for providing/fabricating a substrate that includes an embedded trench with selective electroless copper fill in the trench and semi additive process formed traces on the surface of the dielectric layer.

Figure 10A:
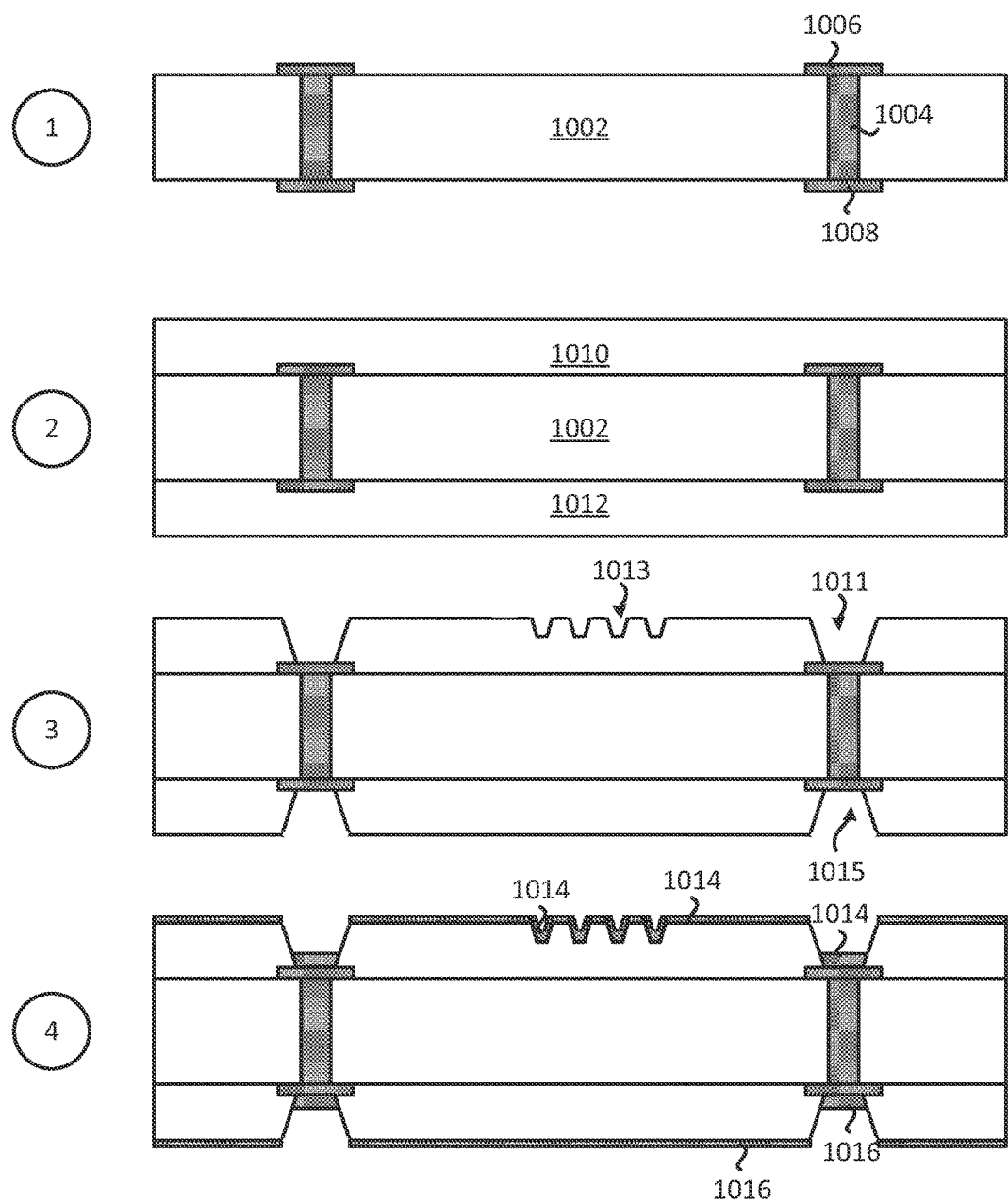
Figure 10B:
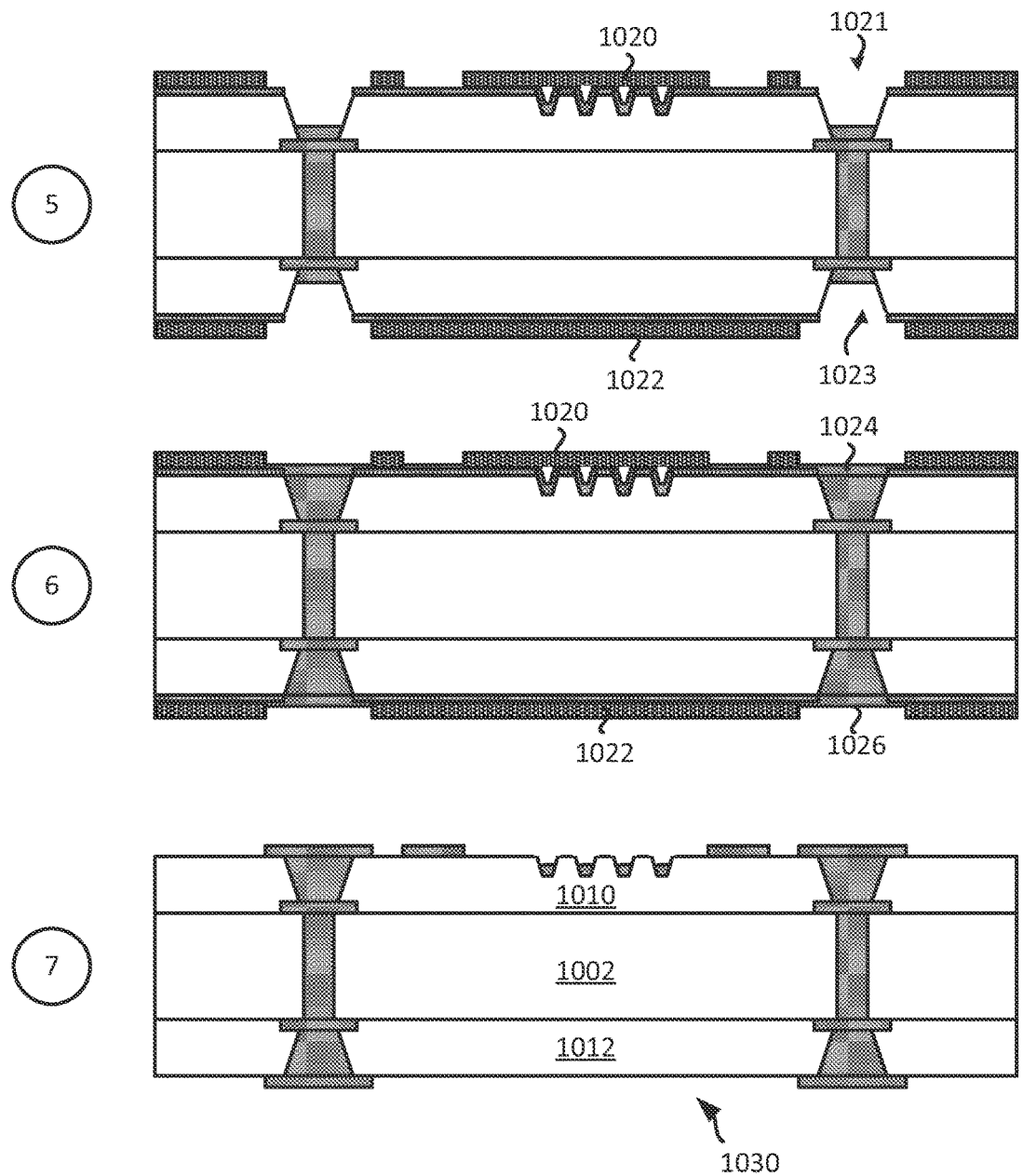

FIG. 10 (comprising FIG. 10A and FIG. 10B) illustrates an exemplary sequence for providing/fabricating a substrate that includes an electroless metal layer.

Figure 11:
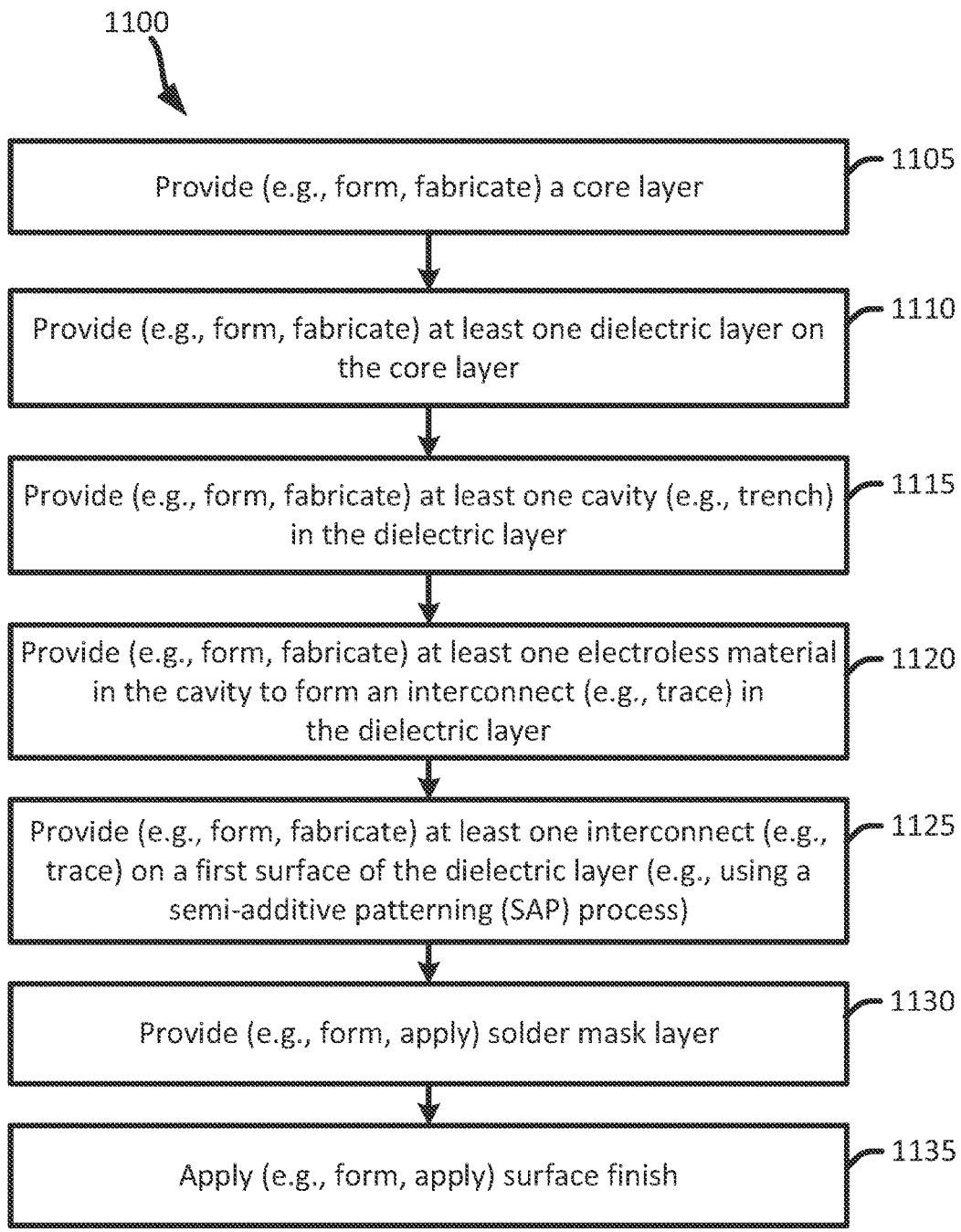

FIG. 11 illustrates a flow diagram of a method for providing/fabricating a substrate that includes an electroless metal layer.

Figure 12:
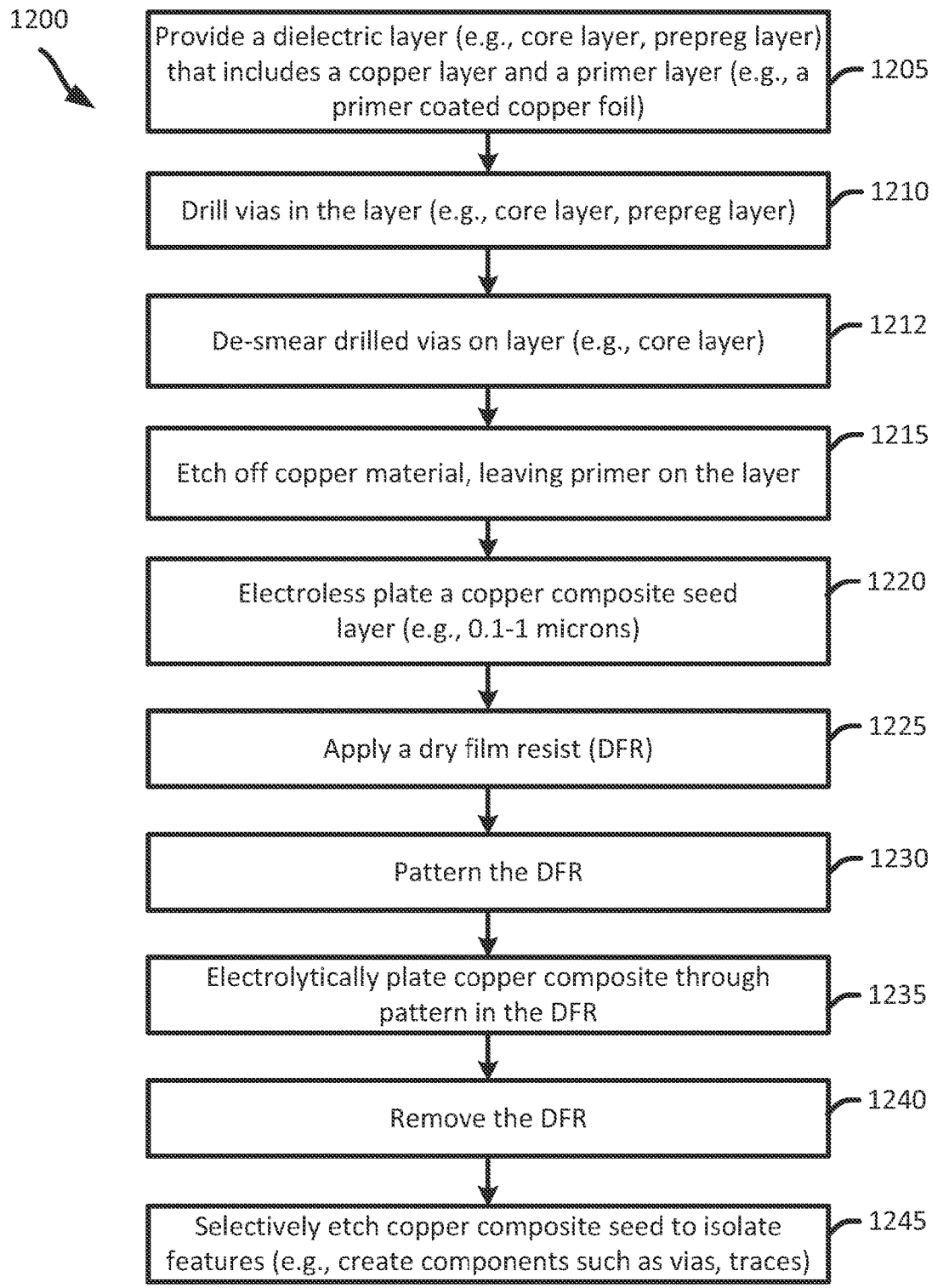

FIG. 12 illustrates a flow diagram of a method for providing/fabricating an interconnect using a semi-additive patterning (SAP) process.

Figure 13:
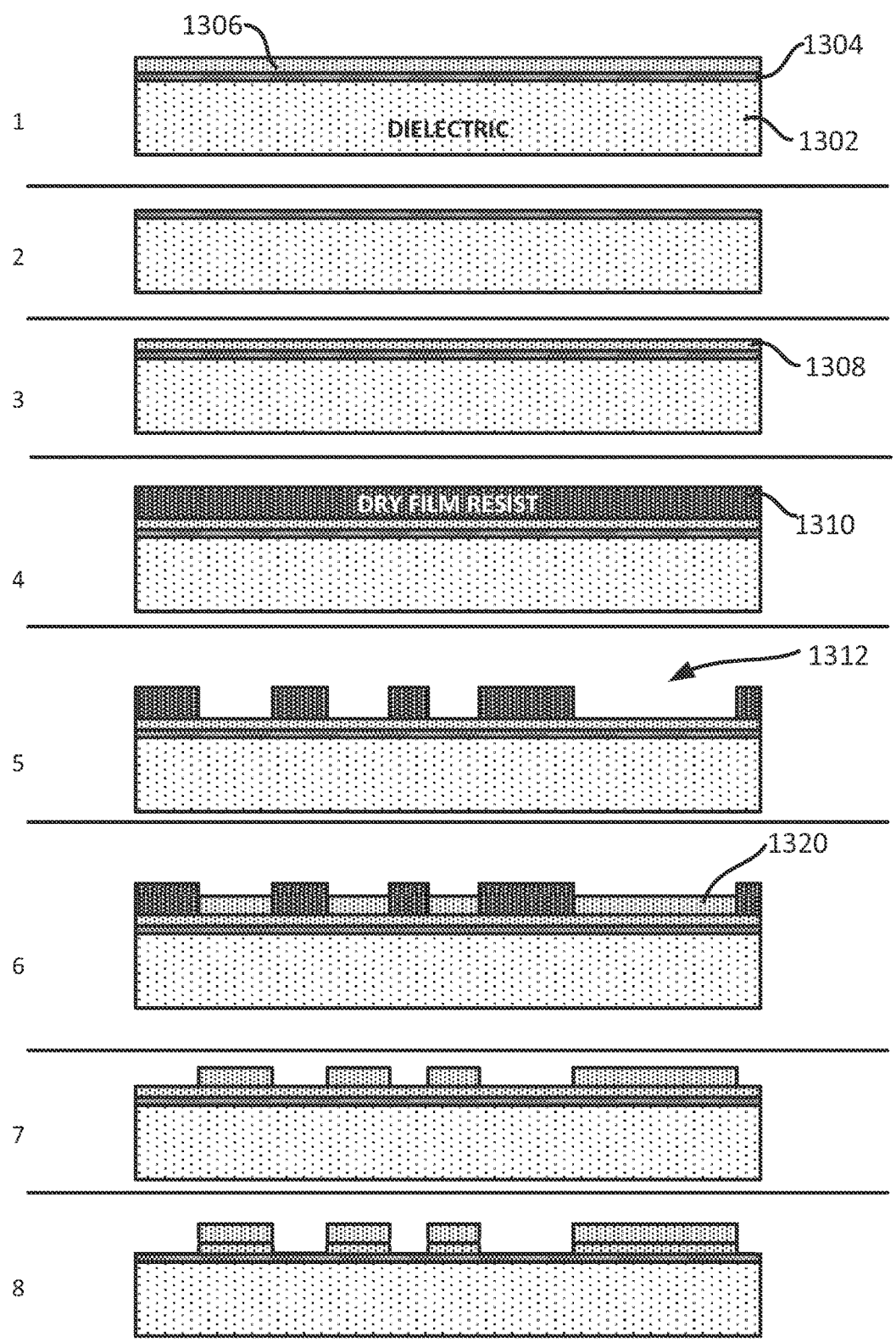

FIG. 13 illustrates a sequence for providing/fabricating an interconnect using a semi-additive patterning (SAP) process.

Figure 14:
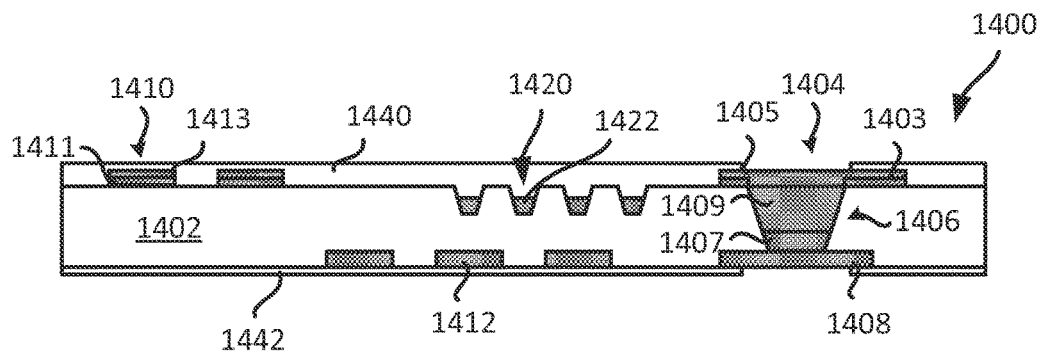

FIG. 14 illustrates another example of a coreless substrate that includes an embedded trench with selective electroless copper fill in the trench and semi additive process formed traces on the surface of the dielectric layer.

Figure 15:
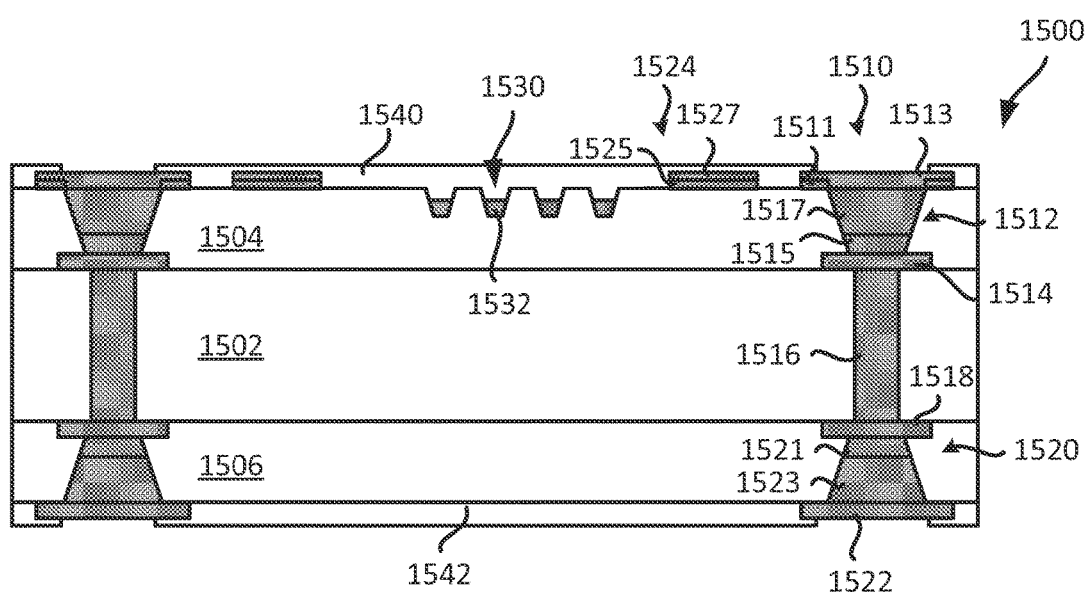

FIG. 15 illustrates another example of a cored substrate that includes an embedded trench with selective electroless copper fill in the trench and semi additive process formed traces on the surface of the dielectric layer.

Figure 16:
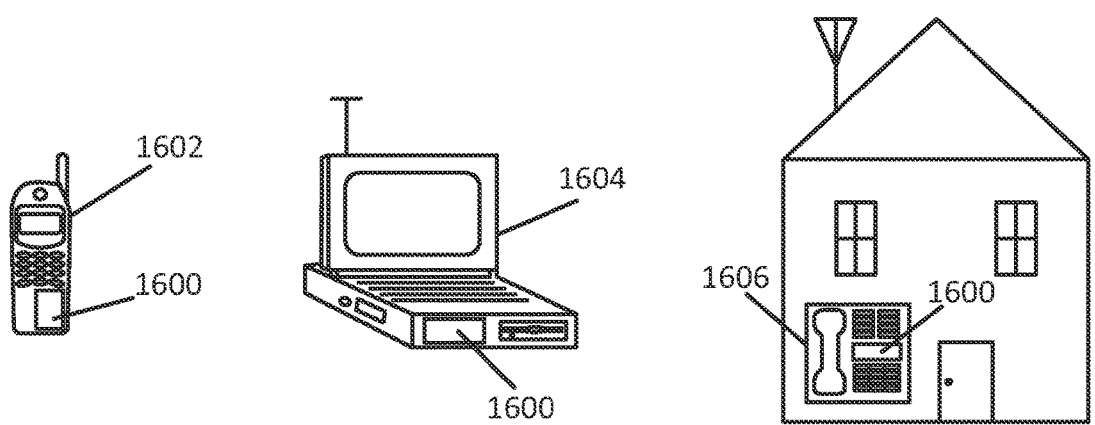

FIG. 16 illustrates various electronic devices that may integrate a semiconductor device, a die, a package substrate, an integrated circuit and/or PCB described herein.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to a substrate that includes a first dielectric layer, a first interconnect, a first cavity, and a first electroless metal layer. The first dielectric layer includes a first surface and a second surface. The first interconnect is on the first surface of the substrate layer. The first cavity traverses the first surface of the first dielectric layer. The first electroless metal layer is selectively formed on the surface of the first dielectric layer, including in at least the first cavity of the first dielectric layer. In some implementations, a second metal layer is selectively formed on portions of the first electroless metal layer. In some implementations, the second metal layer is selectively formed using semi-additive patterning (SAP) process. In some implementations, the first electroless metal layer formed in the first cavity defines an embedded high density interconnect. In some implementations, the first electroless metal layer and/or the second metal layer defines an interconnect (e.g., trace, pad) on the surface of the first dielectric layer. In some implementations, the package substrate includes a core layer coupled to the first dielectric layer. In some implementations, the core layer includes a set of interconnects.

Exemplary Package Substrate that Includes an Electroless Metal Layer

Figure 1:
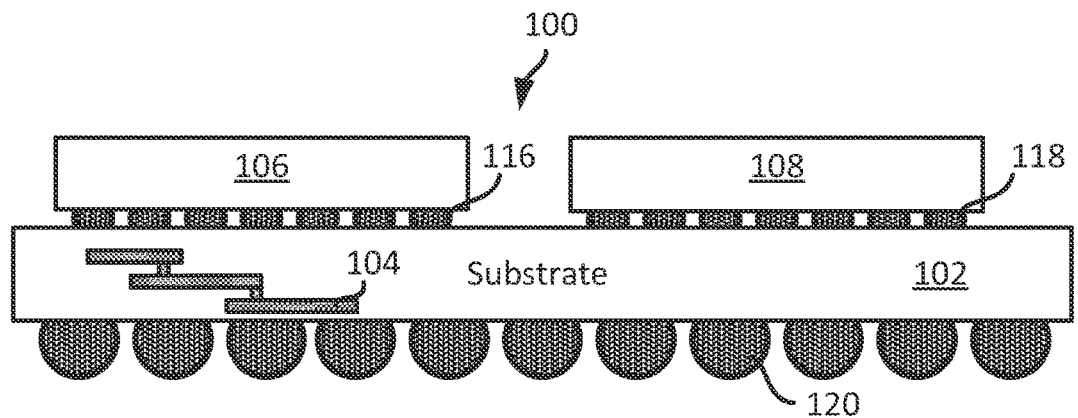
FIG. 1 illustrates a profile view of a conventional integrated device.
Figure 2:
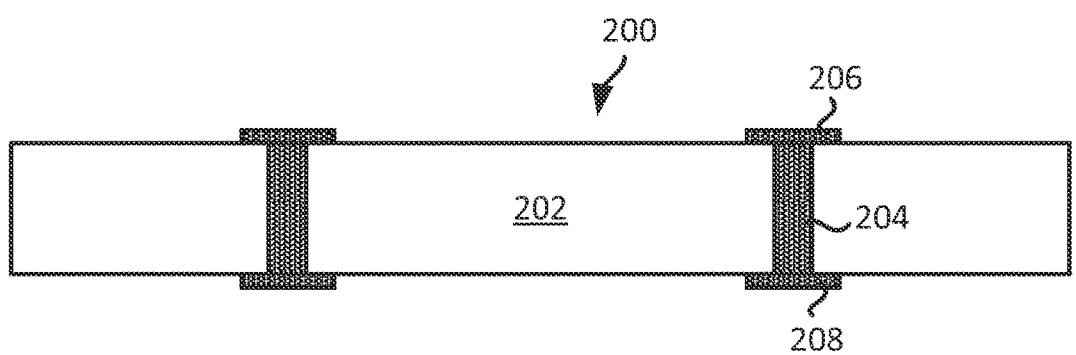
FIG. 2 illustrates an example of a core of a package substrate.
Figure 3:
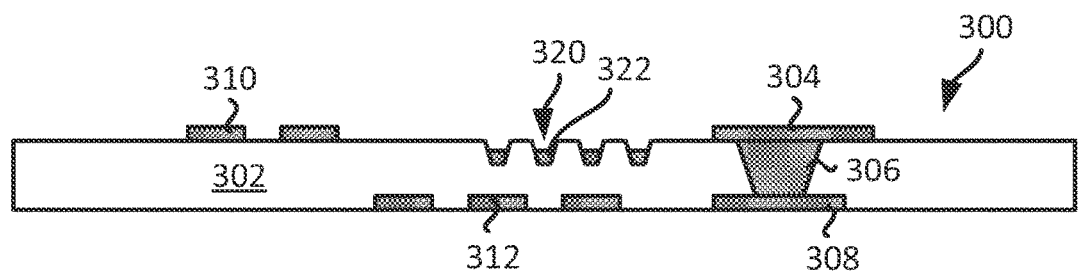
FIG. 3 illustrates an example of a coreless substrate that includes an embedded trench with selective electroless copper fill in the trench and semi additive process formed traces on the surface of the dielectric layer.

FIG. 3 conceptually illustrates an example a package substrate that includes surface interconnects and a cavity that includes an electroless fill. Specifically, FIG. 3 illustrates a package substrate 300 that includes a first dielectric layer 302, a first pad 304, a via 306, a second pad 308, a first interconnect 310, a second interconnect 312, a first cavity 320, and a third interconnect 322.

The first dielectric layer 302 has a first surface (e.g., top surface) and a second surface (e.g., bottom surface). The first surface is opposite to the second surface. Different implementations may use different materials for the first dielectric layer 302. In some implementations, the first dielectric layer 302 may be a filled epoxy.

The first pad 304 is located on the first surface of the substrate 302. The via 306 traverses the first dielectric layer 302. The first pad 304 is coupled to a first portion (e.g., top portion, top surface) of the via 306. The second pad 308 is embedded in the second surface of the first dielectric layer 302. The second pad 308 is coupled to a second portion (e.g., bottom portion, bottom surface) of the via 306. Different implementations may use different materials for the first pad 304, the via 306, and/or the second pad 308. In some implementations, the first pad 304, the via 306, and the second pad 308 includes a metal layer (e.g., copper layer).

The first interconnect 310 is on the first surface of the first dielectric layer 302. In some implementations, the first interconnect 310 is a trace on the first surface of the first dielectric layer 302. The second interconnect 312 is embedded in the second surface of the first dielectric layer 302. In some implementations, the second interconnect 312 is a trace embedded in the second surface of the first dielectric layer 302. Different implementations may use different materials for the first and second interconnects 310 and 312. In some implementations, the first and second interconnects 310 and 312 include a metal layer (e.g., copper layer).

FIG. 3 also illustrates that the cavity 320 traverses the first surface of the first dielectric layer 302. Different implementations may use different process for fabricating the cavity 320 in the first dielectric layer 302. In some implementations, the cavity 320 partially traverses the first dielectric layer 302 through the first surface of the first dielectric layer 302. In some implementations, the cavity 320 is at least partially filled with the third interconnect 322. In some implementations, the third interconnect 322 is a trace that is made of an electroless fill. In some implementations, the electroless fill is an electroless metal layer (e.g., electroless copper layer).

In some implementations, the third interconnect 322 are high density and/or fine pitch interconnects that electrically couple two dies on the package substrate. An example of interconnects that may electrically couple two dies is further described in FIG. 7. In some implementations, the spacing between two adjacent interconnects 322 (e.g., traces, electroless fill interconnect in the trench) is about 5 microns (μm) or less. In some implementations, the spacing between two adjacent interconnects (e.g., traces) is about 3 microns (μm) or less.

In some implementations, the third interconnect 322 is made of a different material than the first interconnect 310 and/or the second interconnect 312. For example, the third interconnect 322 includes an electroless metal layer, and the first interconnect 310 and/or the second interconnect 312 includes a metal layer.

FIG. 3 illustrates a package substrate without a core layer. However, in some implementations, a package substrate may include a core layer.

Figure 4:
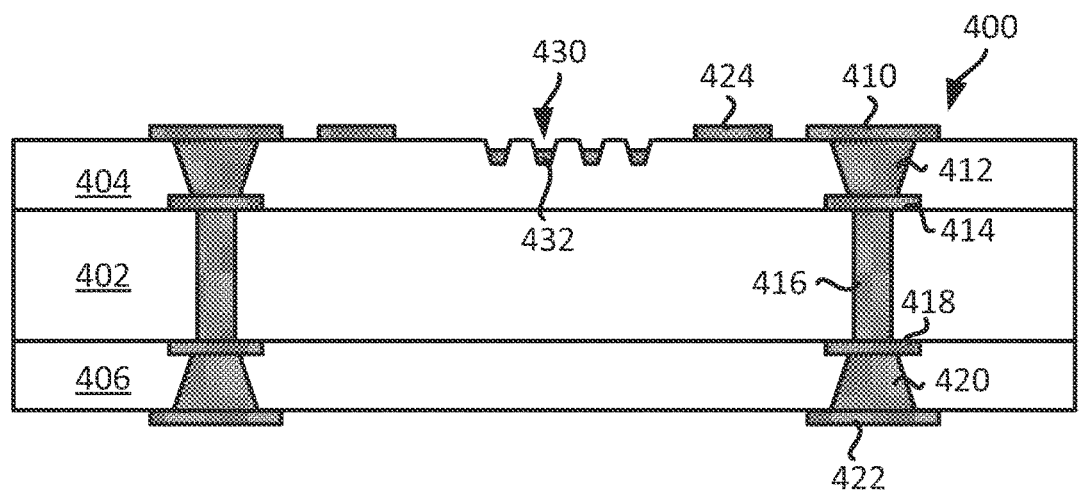
FIG. 4 illustrates an example of a cored substrate that includes an embedded trench with selective electroless copper fill in the trench and semi additive process formed traces on the surface of the dielectric layer.

FIG. 4 conceptually illustrates an example a package substrate that includes a core layer, surface interconnects and a cavity that includes an electroless fill. Specifically, FIG. 4 illustrates a package substrate 400 that includes a core layer 402, a first dielectric layer 404, a second dielectric layer 406, a first pad 410, a first via 412, a second pad 414, a second via 416, a third pad 418, a third via 420, and a fourth pad 422. The package substrate 400 also includes a first interconnect 424, a cavity 430, and a second interconnect 432.

The core layer 402 has a first surface (e.g., top surface) and a second surface (e.g., bottom surface). The first surface is opposite to the second surface. Different implementations may use different materials for the core layer 402. In some implementations, the core layer 402 may be made of at least one of a dielectric layer. The first dielectric layer 404 is coupled to the first surface of the core layer 402. The second dielectric layer 406 is coupled to the second surface of the core layer 402. In some implementations, the first dielectric layer 404 and the second dielectric layer 406 are prepeg dielectric layers.

The first pad 410 is located on a first surface (e.g., top surface) of the first dielectric layer 404. The first via 412 traverses the first dielectric layer 404. The first pad 410 is coupled to a first portion (e.g., top portion, top surface) of the first via 412. The second pad 414 is embedded in a second surface (e.g., bottom surface) of the first dielectric layer 404. The second pad 414 is coupled to a second portion (e.g., bottom portion, bottom surface) of the first via 412.

The second via 416 traverses the core layer 402. The second pad 414 is coupled to a first portion (e.g., top portion, top surface) of the second via 416. The second pad 414 is on the first surface of the core layer 402. The third pad 418 is coupled to a second portion (e.g., bottom portion, bottom surface) of the second via 416.

The third pad 418 is on the second surface (e.g., bottom surface) of the core layer 402. The third pad 418 is embedded in a first surface of the second dielectric layer 406. The third via 420 traverses the second dielectric layer 406. The third pad 418 is coupled to a first portion (e.g., top portion, top surface) of the third via 420. The fourth pad 422 is on a second surface (e.g., bottom surface) of the second dielectric layer 406. The fourth pad 422 is coupled to a second portion (e.g., bottom portion, bottom surface) of the third via 420.

Different implementations may use different materials for the first pad 410, the first via 412, the second pad 414, the second via 416, the third pad 418, the third via 420, and the fourth pad 422. In some implementations, the first pad 410, the first via 412, the second pad 414, the second via 416, the third pad 418, the third via 420, and the fourth pad 422 includes a metal layer (e.g., copper layer).

The first interconnect 424 is on the first surface of the first dielectric layer 404. In some implementations, the first interconnect 424 is a trace on the first surface of the first dielectric layer 402. Different implementations may use different materials for the first interconnect 424. In some implementations, the first interconnect 424 include a metal layer (e.g., copper layer).

FIG. 4 also illustrates that the cavity 430 traverses the first surface of the first dielectric layer 404. Different implementations may use different process for fabricating the cavity 430 in the first dielectric layer 404. In some implementations, the cavity 430 partially traverses the first dielectric layer 404 through the first surface of the first dielectric layer 404. In some implementations, the cavity 430 is at least partially filled with the second interconnect 432. In some implementations, the second interconnect 432 is a trace that is made of an electroless fill. In some implementations, the electroless fill is an electroless metal layer (e.g., electroless copper layer).

In some implementations, the second interconnect 432 is a high density and/or fine pitch interconnects that electrically couple two dies on the package substrate. An example of interconnects that may electrically couple two dies is further described in FIG. 7. In some implementations, the spacing between two adjacent interconnects 432 (e.g., traces, electroless fill interconnect in trench) is about 5 microns (μm) or less. In some implementations, the spacing between two adjacent interconnects (e.g., traces) is about 3 microns (μm) or less.

In some implementations, the second interconnect 432 is made of a different material than the first interconnect 424. For example, the second interconnect 432 includes an electroless metal layer, and the first interconnect 424 includes a metal layer.

Figure 5:
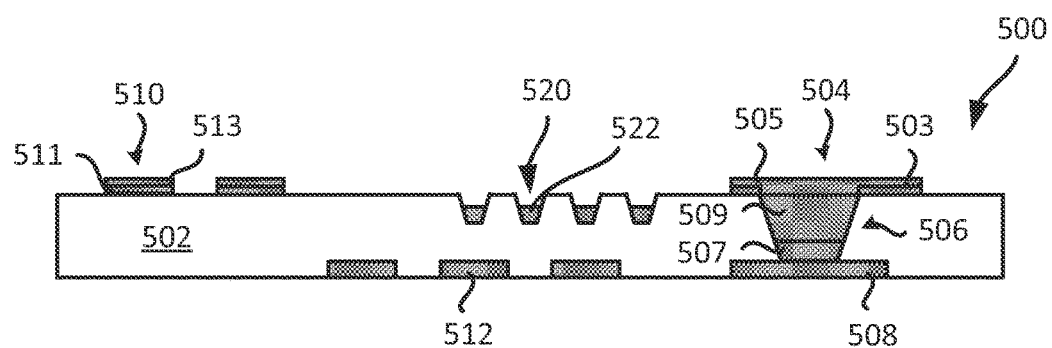
FIG. 5 illustrates an example of a coreless substrate that includes an embedded trench with selective electroless copper fill in the trench and semi additive process formed traces on the surface of the dielectric layer.
Figure 6:
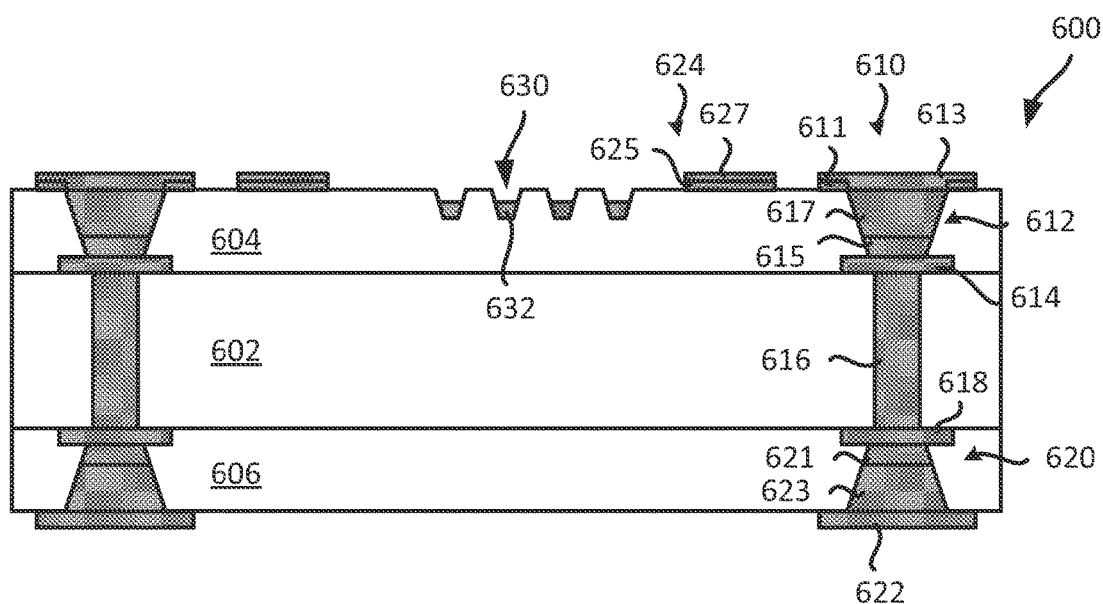
FIG. 6 illustrates an example of a cored substrate that includes an embedded trench with selective electroless copper fill in the trench and semi additive process formed traces on the surface of the dielectric layer.

FIGS. 3-4 illustrate exemplary high level package substrates of some implementations. FIGS. 5-6 illustrates exemplary package substrates with more details. In some implementations, the package substrates of FIGS. 5-6 are similar to the package substrates of FIGS. 3-4, except that FIGS. 5-6 have more detail.

FIG. 5 conceptually illustrates an example a package substrate that includes surface interconnects and a cavity that includes an electroless fill. Specifically, FIG. 5 illustrates a package substrate 500 that includes a first dielectric layer 502, a first pad 504, a via 506, a second pad 508, a first interconnect 510, a second interconnect 512, a first cavity 520, and a third interconnect 522. The first dielectric layer 502 has a first surface (e.g., top surface) and a second surface (e.g., bottom surface). The first surface is opposite to the second surface. Different implementations may use different materials for the first dielectric layer 502. In some implementations, the first dielectric layer 502 may be a substrate.

The first pad 504 is located on the first surface of the substrate 502. In some implementations, the first pad 504 includes a first metal layer 503 and a second metal layer 505. In some implementations, the first metal layer 503 is a seed layer. In some implementations, the first metal layer 503 is an electroless fill layer (e.g., electroless metal layer). The via 506 traverses the first dielectric layer 502. In some implementations, the via 506 includes a first metal layer 507 and a second metal layer 509. In some implementations, the first metal layer 507 is a seed layer. In some implementations, the first metal layer 507 is an electroless fill layer (e.g., electroless metal layer). In some implementations, the first metal layer 507 may also be formed on the side walls of the via 506.

The first pad 504 is coupled to a first portion (e.g., top portion, top surface) of the via 506. The second pad 508 is embedded in the second surface of the first dielectric layer 502. The second pad 508 is coupled to a second portion (e.g., bottom portion, bottom surface) of the via 506. Different implementations may use different materials for the first pad 504, the via 506, and the second pad 508. In some implementations, the first pad 504, the via 506, and the second pad 508 includes a metal layer (e.g., copper layer).

The first interconnect 510 is on the first surface of the first dielectric layer 502. In some implementations, the first interconnect 510 is a trace on the first surface of the first dielectric layer 502. In some implementations, the first interconnect 510 includes a first metal layer 511 and a second metal layer 513. In some implementations, the first metal layer 511 is a seed layer. In some implementations, the first metal layer 511 is an electroless fill layer (e.g., electroless metal layer)

The second interconnect 512 is embedded in the second surface of the first dielectric layer 502. In some implementations, the second interconnect 512 is a trace embedded in the second surface of the first dielectric layer 502. Different implementations may use different materials for the first and second interconnects 510 and 512. In some implementations, the first and second interconnects 510 and 512 include a metal layer (e.g., copper layer).

FIG. 5 also illustrates that the cavity 520 traverses the first surface of the first dielectric layer 502. Different implementations may use different process for fabricating the cavity 520 in the first dielectric layer 502. In some implementations, the cavity 520 partially traverses the first dielectric layer 502 through the first surface of the first dielectric layer 502. In some implementations, the cavity 520 is at least partially filled with the third interconnect 522. In some implementations, the third interconnect 522 is a trace that is made of an electroless fill. In some implementations, the electroless fill is an electroless metal layer (e.g., electroless copper layer).

In some implementations, the third interconnect 522 is a high density and/or fine pitch interconnects that electrically couple two dies on the package substrate. An example of interconnects that may electrically couple two dies is further described in FIG. 7. In some implementations, the spacing between two adjacent interconnects 522 (e.g., traces) is about 5 microns (μm) or less. In some implementations, the spacing between two adjacent interconnects (e.g., traces) is about 3 microns (μm) or less.

In some implementations, the third interconnect 522 is made of a different material than the first interconnect 510 and/or the second interconnect 512. For example, the third interconnect 522 includes an electroless metal layer, and the first interconnect 510 and/or the second interconnect 512 includes a metal layer.

FIG. 5 illustrates a package substrate without a core layer (e.g., coreless package substrate). However, in some implementations, a package substrate may include a core layer (e.g., cored package substrate).

FIG. 6 conceptually illustrates an example a package substrate that includes a core layer, surface interconnects and a cavity that includes an electroless fill. Specifically, FIG. 6 illustrates a package substrate 600 that includes a core layer 602, a first dielectric layer 604, a second dielectric layer 606, a first pad 610, a first via 612, a second pad 614, a second via 616, a third pad 618, a third via 620, and a fourth pad 622. The package substrate 600 also includes a first interconnect 624, a cavity 630, and a second interconnect 632

The core layer 602 has a first surface (e.g., top surface) and a second surface (e.g., bottom surface). The first surface is opposite to the second surface. Different implementations may use different materials for the core layer 602. In some implementations, the core layer 602 may be made of at least one of a dielectric layer. The first dielectric layer 604 is coupled to the first surface of the core layer 602. The second dielectric layer 606 is coupled to the second surface of the core layer 602. In some implementations, the first dielectric layer 604 and the second dielectric layer 606 are prepeg dielectric layers.

The first pad 610 is located on a first surface (e.g., top surface) of the first dielectric layer 604. In some implementations, the first pad 610 includes a first metal layer 611 and a second metal layer 613. In some implementations, the first metal layer 611 is a seed layer. In some implementations, the first metal layer 611 is an electroless fill layer (e.g., electroless metal layer). The first via 612 traverses the first dielectric layer 604. The first pad 610 is coupled to a first portion (e.g., top portion, top surface) of the first via 612. In some implementations, the first via 612 includes a first metal layer 615 and a second metal layer 617. In some implementations, the first metal layer 615 may also be formed on the side walls of the via 612. In some implementations, the first metal layer 615 is a seed layer. In some implementations, the first metal layer 615 is an electroless fill layer (e.g., electroless metal layer). The second pad 614 is embedded in a second surface (e.g., bottom surface) of the first dielectric layer 604. The second pad 614 is coupled to a second portion (e.g., bottom portion, bottom surface) of the first via 612.

The second via 616 traverses the core layer 602. The second pad 614 is coupled to a first portion (e.g., top portion, top surface) of the second via 616. The second pad 614 is on the first surface of the core layer 602. The third pad 618 is coupled to a second portion (e.g., bottom portion, bottom surface) of the second via 616.

The third pad 618 is on the second surface (e.g., bottom surface) of the core layer 602. The third pad 618 is embedded in a first surface of the second dielectric layer 606. The third via 620 traverses the second dielectric layer 606. The third pad 618 is coupled to a first portion (e.g., top portion, top surface) of the third via 620. The fourth pad 622 is on a second surface (e.g., bottom surface) of the second dielectric layer 606. The fourth pad 622 is coupled to a second portion (e.g., bottom portion, bottom surface) of the third via 620. In some implementations, the third via 620 includes a first metal layer 621 and a second metal layer 623. In some implementations, the first metal layer 621 may also be formed on the side walls of the via 620. In some implementations, the first metal layer 621 is a seed layer. In some implementations, the first metal layer 621 is an electroless fill layer (e.g., electroless metal layer).

Different implementations may use different materials for the first pad 610, the first via 612, the second pad 614, the second via 616, the third pad 618, the third via 620, and the fourth pad 622. In some implementations, the first pad 610, the first via 612, the second pad 614, the second via 616, the third pad 618, the third via 620, and the fourth pad 622 includes a metal layer (e.g., copper layer).

The first interconnect 624 is on the first surface of the first dielectric layer 604. In some implementations, the first interconnect 624 is a trace on the first surface of the first dielectric layer 602. Different implementations may use different materials for the first interconnect 624. In some implementations, the first interconnect 624 include a metal layer (e.g., copper layer). In some implementations, the first interconnect 624 includes a first metal layer 625 and a second metal layer 627. In some implementations, the first metal layer 625 is a seed layer. In some implementations, the first metal layer 627 is an electroless fill layer (e.g., electroless metal layer).

FIG. 6 also illustrates that the cavity 630 traverses the first surface of the first dielectric layer 604. Different implementations may use different process for fabricating the cavity 630 in the first dielectric layer 604. In some implementations, the cavity 630 partially traverses the first dielectric layer 604 through the first surface of the first dielectric layer 604. In some implementations, the cavity 630 is at least partially filled with the second interconnect 632. In some implementations, the second interconnect 632 is a trace that is made of an electroless fill. In some implementations, the electroless fill is an electroless metal layer (e.g., electroless copper layer).

In some implementations, the second interconnect 632 is a high density and/or fine pitch interconnects that electrically couple two dies on the package substrate. An example of interconnects that may electrically couple two dies is further described in FIG. 7. In some implementations, the spacing between two adjacent interconnects 632 (e.g., traces) is about 5 microns ($\mu$m) or less. In some implementations, the spacing between two adjacent interconnects (e.g., traces) is about 3 microns ($\mu$m) or less.

In some implementations, the second interconnect 632 is made of a different material than the first interconnect 624. For example, the second interconnect 632 includes an electroless metal layer, and the first interconnect 624 includes a metal layer.

FIGS. 3-6 illustrate packages without a solder resist layer. However, in some implementations, one or more solder resist layers may be selectively formed on a the first surface (e.g., top surface) and/or the second surface (e.g., bottom surface) of the package. Several examples of packages with one or more solder resist layers are described in FIGS. 14-15.

Exemplary Package Substrate that Includes an Electroless Metal Layer

Figure 7:
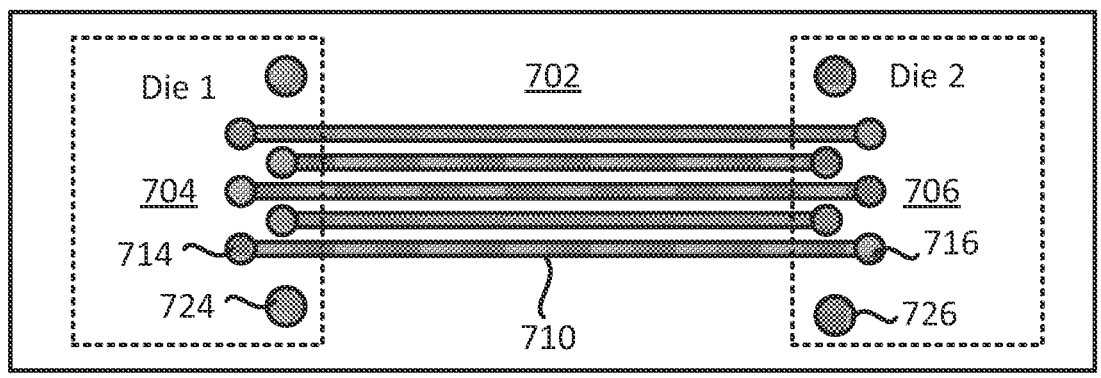
FIG. 7 illustrates an example of a plan view of a substrate that includes an embedded trench with selective electroless copper fill in the trench and semi additive process formed traces on the surface of the dielectric layer.

FIG. 7 illustrates an example of a plan view of a package substrate coupled to two dies. Specifically, FIG. 7 illustrates a package substrate 702, a first die 704, a second die 706, a set of interconnects 710, a first set of pads 714, a second set of pads 716, a third pad 724, and a fourth pad 726. In some implementations, the package substrate 702 is representative of at least one of the package substrates 300, 400, 500, and/or 600 of FIGS. 3, 4, 5, and/or 6. However, the package substrate 702 may represent other package substrate in the present disclosure.

The set of interconnects 710 are embedded traces on the surface of the package substrate 702. In some implementations, the set of interconnects 710 are traces made of an electroless fill. In some implementations, the electroless fill is an electroless metal layer (e.g., electroless copper layer). In some implementations, the set of interconnects 710 may include at least one of the interconnects 322, 432, 522, and/or 632 from FIGS. 3, 4, 5, and/or 6. In some implementations, the set of interconnects 710 are located in a set of cavities in the package substrate 702. In some implementations, at least part of the set of interconnects 710 is covered with a solder resist layer. In some implementations, at least part of the package substrate 702 is covered with a solder resist layer. Examples of package substrates covered with one or more solder resist layers are further described in FIGS. 14-15.

In some implementations, the set of interconnects 710 are high density and/or fine pitch interconnects that electrically couple the first die 704 and the second die 706. In some implementations, the spacing between two adjacent interconnects (e.g., traces) from the set of interconnects 710 is about 5 microns ($\mu$m) or less. In some implementations, the spacing between two adjacent interconnects (e.g., traces) from the set of interconnects 710 is about 3 microns (μm) or less.

The set of interconnects 710 is coupled to the first set of pads 714. The first set of pads 714 may be coupled to the first die 704. The set of interconnects 710 is coupled to the second set of pads 716. The second set of pads 716 may be coupled to the second die 706. The third pad 724 may be a via pad. The third pad 724 may be coupled to the first die 704. The fourth pad 726 may be a via pad. The fourth pad 726 may be coupled to the second die 706.

Exemplary Sequence for Providing a Package Substrate that Includes an Electroless Metal Layer In some implementations, providing a package substrate that includes an cavity that includes an electroless fill includes several processes. FIG. 8 (which includes FIGS. 8A-8C) illustrates an exemplary sequence for providing a package substrate. In some implementations, the sequence of FIGS. 8A-8C may be used to provide/manufacture the package substrate of FIGS. 3 and/or 5, and/or other package substrates described in the present disclosure.

Figure 8A:
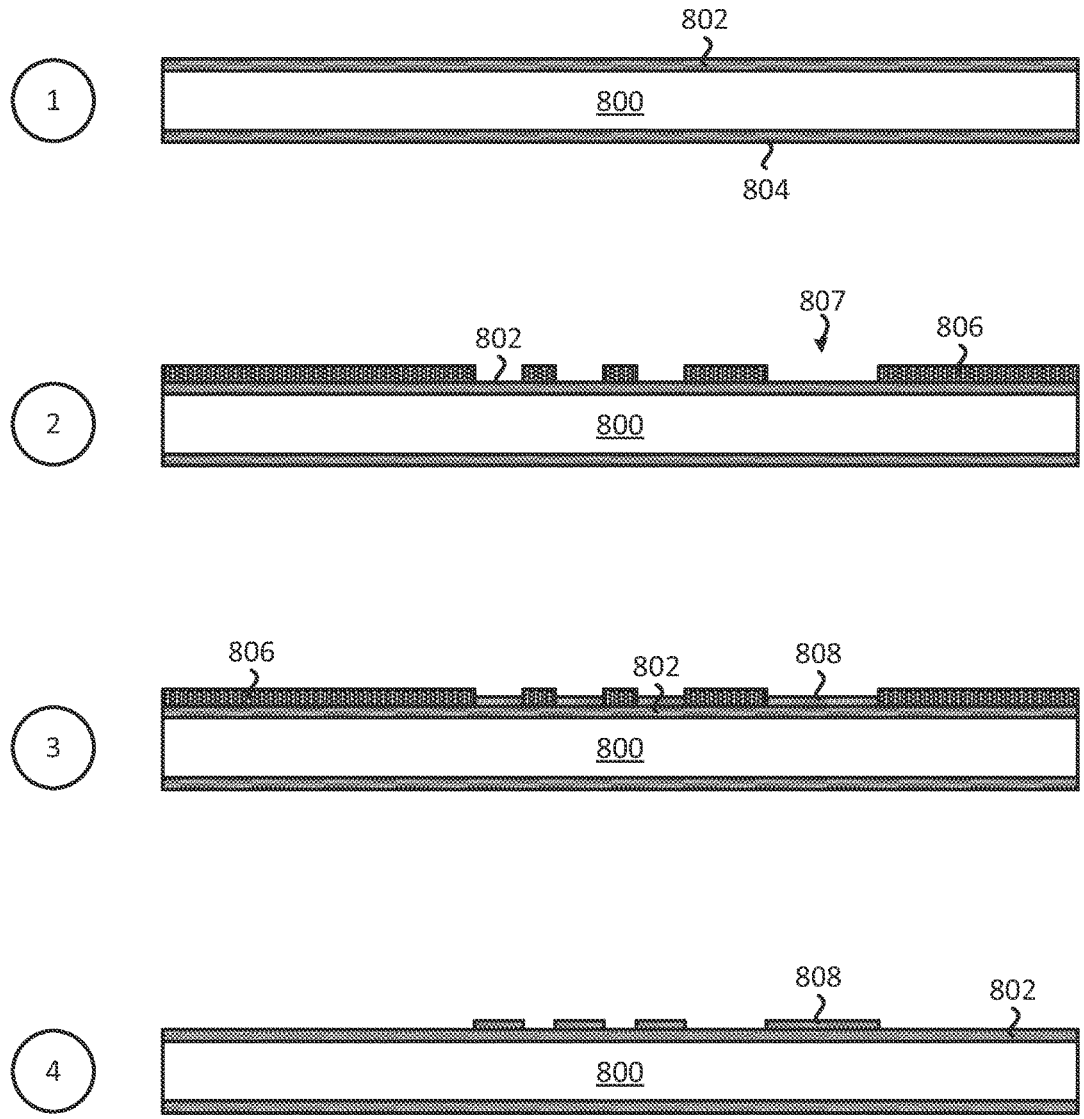
Figure 8B:
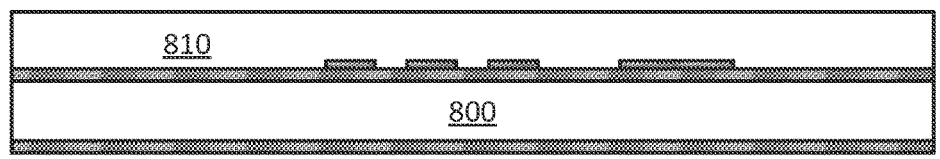
Figure 8B:
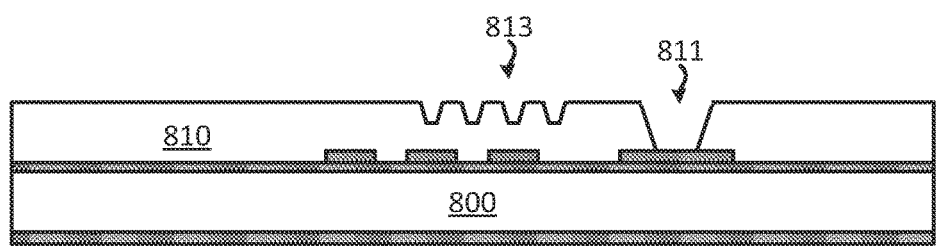
Figure 8B:
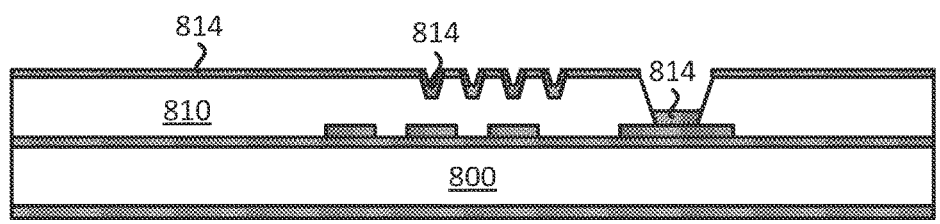
Figure 8C:
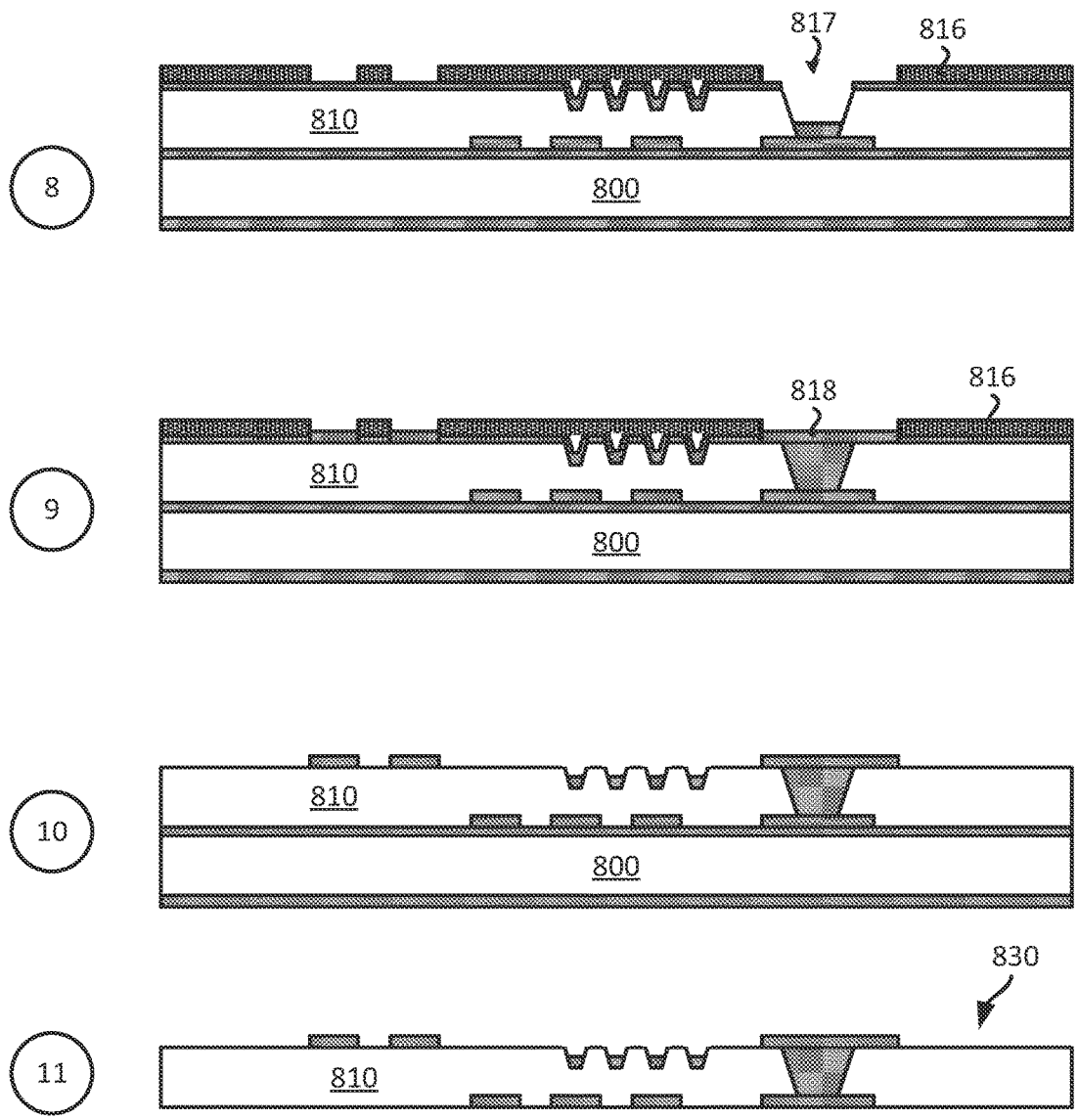

It should be noted that the sequence of FIGS. 8A-8C may combine one or more stages in order to simplify and/or clarify the sequence for providing a package substrate.

As shown in stage 1 of FIG. 8A, a core layer 800 is provided. In some implementations, the core layer 800 is a temporary core layer. In some implementations, providing the core layer 800 may include receiving a core layer from a supplier or fabricating a core layer. Different implementations may use different materials for the core layer. In some implementations, the core layer 800 is a dielectric layer. The core layer 800 includes a first metal layer 802 and a second metal layer 804. The first metal layer 802 is coupled to a first surface (e.g., top surface) of the core layer 800. The second metal layer 804 is coupled to a second surface (e.g., bottom surface) of the core layer 800. In some implementations, providing the core layer includes providing the first metal layer 802 and/or the second metal layer 804. In some implementations, providing the first metal layer 802 and/or the second metal layer 804 includes receiving the first metal layer 802 and/or the second metal layer 804 with the core layer 800 from a supplier or fabricating the first metal layer 802 and/or the second metal layer 804 on the core layer 800.

At stage 2, a dry film resist (DFR) 806 is provided on the first metal layer 802. In some implementations, providing the DFR 806 includes forming (e.g., laminating) the DFR 806 on the first metal layer 802, and selectively removing the DFR 806 to define a pattern on the first metal layer 802. In some implementations, these patterns include one or more cavities (e.g., cavity 807) in the DFR 806. In some implementations, selectively removing the DFR 806 includes exposing the DFR 806, and developing the DFR 806 to form the pattern that includes one or more cavities.

At stage 3, a third metal layer 808 is provided in the cavities (e.g., cavity 807) of the DFR 806. Different implementations may provide the third metal layer 808 differently. In some implementations, the third metal layer 808 is formed in one or more cavities and on the first metal layer 802. In some implementations, the third metal layer 808 is provided using a metal plating process.

At stage 4, the DFR 806 is removed. In some implementations, removing the DFR 806 includes stripping the DFR 806, leaving the third metal layer 808. Different implementations may use different processes for removing the DFR 806.

At stage 5, as shown in FIG. 8B, a first dielectric layer 810 is provided on the first metal layer 802 (e.g., the first surface of the core layer 800). In some implementations, providing the first dielectric layer 810 includes forming (e.g., laminating) the first dielectric layer 810 on the first metal layer 802 of the core layer 800. In some implementations, the first dielectric layer 810 is formed about the third metal layer 808.

At stage 6, several cavities (e.g., first cavity 811, second set of cavities 813) are formed in the first dielectric layer 810. As shown at stage 6, the first cavity 811 is formed about a portion of the third metal layer 808 and traverses the first dielectric layer 810. In some implementations, the first cavity 811 is a cavity configured to define a via in the first dielectric layer 810. The second set of cavities 813 partially traverses the first dielectric layer 810. In some implementations, the second set of cavities 813 is a set of cavities configured to define a set of interconnects (e.g., traces) embedded in the first dielectric layer 810. Different implementations may use different processes for forming the cavities in the first dielectric layer 810. In some implementations, a laser process is used to form the cavities in the first dielectric layer 810. In some implementations, the laser process allows for the second set of cavities to have a spacing of about 5 microns (μm) or less. In some implementations, the laser process allows for the second set of cavities to have a spacing of about 3 microns (μm) or less.

At stage 7, a fourth metal layer 814 is provided. As shown at stage 7, the fourth metal layer 814 is provided such that a metal layer is formed on a first surface of the first dielectric layer 810. In addition, the fourth metal layer 814 is provided such that at least some of the cavities (e.g., first cavity 811, second set of cavities 813) are at least partially filled with the fourth metal layer 814. In some implementations, the fourth metal layer 814 may be formed on the side walls of the cavities. Stage 7 illustrates the fourth metal layer 814 is not formed on side portions (e.g., side walls) of the cavity 811. However, in some implementations, the fourth metal layer 814 is formed on the entire side portion (e.g., side wall) of the cavity 811. In some implementations, the fourth metal layer 814 is an electroless metal layer (e.g., electroless fill, electroless copper layer). In some implementations, the fourth metal layer 814 is a seed layer. In some implementations, providing the fourth metal layer 814 includes using an electroless plating process. In some implementations, defining the fourth metal layer 814 may define one or more traces in the first dielectric layer 810.

At stage 8, as shown in FIG. 8C, a dry film resist (DFR) 816 is provided on the fourth metal layer 814. In some implementations, providing the DFR 816 includes forming (e.g., laminating) the DFR 816 on the fourth metal layer 814, and selectively removing the DFR 816 to define a pattern on the fourth metal layer 814. In some implementations, these patterns include one or more cavities (e.g., cavity 817) in the DFR 816. In some implementations, selectively removing the DFR 816 includes exposing the DFR 816, and developing the DFR 816 to form the pattern that includes one or more cavities.

At stage 9, a fifth metal layer 818 is provided in the cavities (e.g., cavity 817) of the DFR 816. Different implementations may provide the fifth metal layer 818 differently. In some implementations, the fifth metal layer 818 is formed in one or more cavities and on the fourth metal layer 814. In some implementations, the fifth metal layer 818 is provided using a metal plating process. In some implementations, providing the fifth metal layer 818 may define one or more vias and/or one or more traces in the first dielectric layer 810.

At stage 10, the DFR 816 is removed. In some implementations, removing the DFR 816 includes stripping the DFR 816, leaving the fifth metal layer 818. Different implementations may use different processes for removing the DFR 816.

At stage 11, the core layer 800 and the second metal layer 804 are removed, leaving a package substrate 830. In some implementations, at least some of the first metal layer 802 may also be removed. Thus, in some implementations, the package substrate 830 may or may not include the first metal layer 802. In some implementations, the package substrate 830 is similar to the package substrates 300 and/or 500 of FIGS. 3 and 5. In some implementations, one or more solder resist layers may be selectively added (e.g., formed) to a first surface (e.g., top surface) and/or a second surface (e.g., bottom surface) of the package substrate 830.

Exemplary Method for Providing a Package Substrate

In some implementations, providing a package substrate that includes an electroless embedded interconnect includes several processes. FIG. 9 illustrates an exemplary flow diagram of a method for providing a package substrate. In some implementations, the method of FIG. 9 may be used to provide/fabricate the package substrate of FIGS. 3 and/or 5, and/or other package substrate described in the present disclosure.

It should be noted that the method of FIG. 9 may combine one or more processes in order to simplify and/or clarify the method for providing a package substrate. In some implementations, the method of FIG. 9 may be used to provide the sequence illustrated in FIGS. 8A-8C.

The method provides (at 905) a core layer. In some implementations, providing the core layer may include receiving a core layer from a supplier or fabricating (e.g., forming) a core layer. Different implementations may use different materials for the core layer. Stage 1 of FIG. 8A illustrates an example of providing a core layer.

The method provides (at 910) at least one dielectric layer on the core layer. In some implementations, providing at least one dielectric layer includes forming at least one dielectric layer.

The method provides (at 915) at least one cavity in the dielectric layer. The cavity may traverse part of the dielectric layer or it may traverse the entire dielectric layer. In some implementations, the cavity is a via cavity. In some implementations, the cavity is a trench for an interconnect.

The method provides (at 920) at least one embedded electroless interconnect in the dielectric layer. In some implementations, providing (e.g., forming) at least one embedded electroless interconnect includes at least partially filling the cavity with a metal layer to define the interconnect. In some implementations, the metal layer is electroless metal fill. Stages 5-7 of FIG. 8B illustrates an example of providing at least one electroless interconnect in a dielectric layer.

The method provides (at 925) at least one interconnect on the dielectric layer. In some implementations, providing (e.g., forming) at least one interconnect includes providing an interconnect (e.g., trace, pad) on the surface of the dielectric layer and/or a via in the dielectric layer. Stages 8-10 of FIG. 8C illustrates an example of providing at least one interconnect. In some implementations, providing at least one interconnect on the dielectric layer includes a semi-additive patterning (SAP) process. An example of a SAP process is described in detail in FIGS. 12-13.

The method removes (at 930) the core layer. Stages 10-11 of FIG. 8C illustrates an example of removing a core layer.

The method provides (at 935) a solder resist layer (e.g., solder mask layer) on the dielectric layer. The method further provides (at 940) a surface finish on the solder resist layer and/or the dielectric layer.

Exemplary Sequence for Providing a Package Substrate that Includes an Electroless Metal Layer In some implementations, providing a package substrate that includes an cavity that includes an electroless fill includes several processes. FIG. 10 (which includes FIGS. 10A-10B) illustrates an exemplary sequence for providing a package substrate. In some implementations, the sequence of FIGS. 10A-10B may be used to provide/manufacture the package substrate of FIGS. 4 and/or 6, and/or other package substrate described in the present disclosure.

It should be noted that the sequence of FIGS. 10A-10B may combine one or more stages in order to simplify and/or clarify the sequence for providing a package substrate.

As shown in stage 1 of FIG. 10A, a core layer 1002 is provided. Different implementations may use different materials for the core layer 1002. In some implementations, the core layer 1002 is a dielectric layer. The core layer 1002 includes a first via 1004, a first pad 1006, and a second pad 1008. The first via 1004 traverse the core layer 1002. The first pad 1006 is on a first surface (e.g., top surface) of the core layer 1002. The first pad 1006 is coupled to a first portion of the first via 1004. The second pad 1008 is on a second surface (e.g., top surface) of the core layer 1002. The second pad 10008 is coupled to a second portion of the first via 1008.

In some implementations, providing the core layer 1002 may include receiving a core layer from a supplier or fabricating a core layer. In some implementations, the first via 1004, the first pad 1006, and/or the second pad 1008 are provided (e.g., formed) after receiving the core layer 1002.

At stage 2, a first dielectric layer 1010 (e.g., first prepeg layer) is formed on the first surface (e.g., top surface) of the core layer 1002, and a second dielectric layer 1012 (e.g., second prepeg layer) is formed on the second surface (e.g., bottom surface) of the core layer 1002.

At stage 3, several cavities are formed in the first dielectric layer 1010 and the second dielectric layer 1012. For example, a first cavity 1011 is formed about a portion of the first pad 1006 and traverses the first dielectric layer 1010. In some implementations, the first cavity 1011 is a cavity configured to define a via in the first dielectric layer 1010. A second set of cavities 1113 partially traverses the first dielectric layer 1010. In some implementations, the second set of cavities 1013 is a set of cavities configured to define a set of interconnects (e.g., traces) embedded in the first dielectric layer 1010. A third cavity 1015 is formed about the second pad 1008 and traverses the second dielectric layer 1012. In some implementations, the third cavity 1015 is a cavity configured to define a via in the second dielectric layer 1012.

Different implementations may use different processes for forming the cavities in the first dielectric layer 1010 and the second dielectric layer 1012. In some implementations, a laser process is used to form the cavities in the first and second dielectric layers 1010 and 1012. In some implementations, the laser process allows for the second set of cavities to have a spacing of about 5 microns (μm) or less. In some implementations, the laser process allows for the second set of cavities to have a spacing of about 3 microns (μm) or less.

At stage 4, a first metal layer 1014 is provided. As shown at stage 4, the first metal layer 814 is provided such that a metal layer is formed on a first surface of the first dielectric layer 1010. In addition, the first metal layer 1014 is provided such that at least some of the cavities (e.g., first cavity 1011, second set of cavities 1013) are at least partially filled with the first metal layer 1014. In some implementations, the first metal layer 1014 is an electroless metal layer (e.g., electroless fill, electroless copper layer).

In some implementations, the first metal layer 1014 may be formed on the side walls of the cavities. Stage 4 illustrates the first metal layer 1014 is not formed on side portions (e.g., side walls) of the cavity 1011. However, in some implementations, the first metal layer 1014 is formed on the entire side portion (e.g., side wall) of the cavity 1011. In some implementations, the first metal layer 1014 is a seed layer. In some implementations, providing the first metal layer 1014 includes using an electroless plating process. In some implementations, defining the first metal layer 1014 may define one or more traces in the first dielectric layer 1010.

In addition, at stage 4, a second metal layer 1016 is provided. As shown at stage 4, the second metal layer 816 is provided such that a metal layer is formed on a first surface of the second dielectric layer 1012. Moreover, the second metal layer 1016 is provided such that at least some of the cavities (e.g., third cavity 1015) are at least partially filled with the second metal layer 1016. In some implementations, the second metal layer 1016 may be formed on the side walls of the cavities. In some implementations, the second metal layer 1016 is an electroless metal layer (e.g., electroless fill, electroless copper layer).

In some implementations, the second metal layer 1016 may be formed on the side walls of the cavities. Stage 4 illustrates the second metal layer 1016 is not formed on side portions (e.g., side walls) of the cavity 1015. However, in some implementations, the second metal layer 1016 is formed on the entire side portion (e.g., side wall) of the cavity 1015. In some implementations, the second metal layer 1016 is a seed layer. In some implementations, providing the second metal layer 1016 includes using an electroless plating process.

At stage 5, as shown in FIG. 10B, a first dry film resist (DFR) 1020 is provided on the first metal layer 1014. In some implementations, providing the first DFR 1020 includes forming (e.g., laminating) the first DFR 1020 on the first metal layer 1014, and selectively removing the first DFR 1020 to define a pattern on the first metal layer 1014. In some implementations, these patterns include one or more cavities (e.g., cavity 1021) in the first DFR 1020. In some implementations, selectively removing the first DFR 1020 includes exposing the first DFR 1020, and developing the first DFR 1020 to form the pattern that includes one or more cavities.

Moreover, at stage 5, a second dry film resist (DFR) 1022 is provided on the second metal layer 1016. In some implementations, providing the second DFR 1022 includes forming (e.g., laminating) the second DFR 1022 on the second metal layer 1016, and selectively removing the second DFR 1022 to define a pattern on the second metal layer 1016. In some implementations, these patterns include one or more cavities (e.g., cavity 1023) in the second DFR 1022. In some implementations, selectively removing the second DFR 1022 includes exposing the second DFR 1022, and developing the second DFR 1022 to form the pattern that includes one or more cavities.

At stage 6, a third metal layer 1024 is provided in the cavities (e.g., cavity 1021) of the first DFR 1020. Different implementations may provide the third metal layer 1030 differently. In some implementations, the third metal layer 1024 is formed in one or more cavities and on the first metal layer 1014. In some implementations, the third metal layer 1024 is provided using a metal plating process. In some implementations, providing the third metal layer 1024 may define one or more vias and/or one or more traces in the first dielectric layer 1010.

In addition, at stage 6, a fourth metal layer 1026 is provided in the cavities (e.g., cavity 1023) of the second DFR 1022. Different implementations may provide the fourth metal layer 1026 differently. In some implementations, the fourth metal layer 1032 is formed in one or more cavities and on the second metal layer 1016. In some implementations, the fourth metal layer 1026 is provided using a metal plating process. In some implementations, providing the fourth metal layer 1026 may define one or more vias and/or one or more traces in the second dielectric layer 1012.

At stage 7, the first DFR 1020 and the second DFR 1022 are removed. In some implementations, removing the first and second DFRs 1020 and 1022 includes stripping the first and second DFRs 1020 and 1022, leaving the first and second metal layers 1024 and 1026. Different implementations may use different processes for removing the first and second DFRs 1020 and 1022. Once the first and second DFRs 1020 and 1022, a package substrate 1030 may be provided. In some implementations, the package substrate 1030 is similar to the package substrates 400 and/or 600 of FIGS. 4 and 6. In some implementations, one or more solder resist layers may be selectively added (e.g., formed) to a first surface (e.g., top surface) and/or a second surface (e.g., bottom surface) of the package substrate 1030.

Exemplary Method for Providing a Package Substrate

In some implementations, providing a package substrate that includes an electroless embedded interconnect includes several processes. FIG. 11 illustrates an exemplary flow diagram of a method for providing a package substrate. In some implementations, the method of FIG. 11 may be used to provide/fabricate the package substrate of FIGS. 4 and/or 6, and/or other package substrate described in the present disclosure.

It should be noted that the method of FIG. 11 may combine one or more processes in order to simplify and/or clarify the method for providing a package substrate. In some implementations, the method of FIG. 11 may be used to provide the sequence illustrated in FIGS. 10A-10B.

The method provides (at 1105) a core layer. In some implementations, providing the core layer may include receiving a core layer from a supplier or fabricating (e.g., forming) a core layer. Different implementations may use different materials for the core layer. In some implementations, the core layer may include at least one via and at least one pad. Stage 1 of FIG. 10A illustrates an example of providing a core layer that includes a via and a pad.

The method provides (at 1110) at least one dielectric layer on the core layer. In some implementations, providing at least one dielectric layer includes forming at least one dielectric layer.

The method provides (at 1115) at least one cavity in the dielectric layer. The cavity may traverse part of the dielectric layer or it may traverse the entire dielectric layer. In some implementations, the cavity is a via cavity. In some implementations, the cavity is a trench for an interconnect.

The method provides (at 1120) at least one embedded electroless interconnect in the dielectric layer. In some implementations, providing (e.g., forming) at least one embedded electroless interconnect includes at least partially filling the cavity with a metal layer to define the interconnect. In some implementations, the metal layer is electroless metal fill. Stages 2-4 of FIG. 10A illustrates an example of providing at least one electroless interconnect in a dielectric layer.

The method provides (at 1125) at least one interconnect on the dielectric layer. In some implementations, providing (e.g., forming) at least one interconnect includes providing an interconnect (e.g., trace, pad) on the surface of the dielectric layer and/or a via in the dielectric layer. Stages 4-6 of FIGS. 10A-10B illustrates an example of providing at least one interconnect. In some implementations, providing at least one interconnect on the dielectric layer includes a semi-additive patterning (SAP) process. An example of a SAP process is described in detail in FIGS. 12-13.

The method provides (at 1130) a solder mask layer on the dielectric layer. The method further provides (at 1135) a surface finish on the solder mask layer and/or the dielectric layer.

Exemplary Method and Sequence for Providing a Substrate Using a Semi-Additive Patterning (SAP) Process.

In the present disclosure, numerous methods and sequences are described for providing and/or fabricating a substrate. In some implementations, a semi-additive patterning (SAP) process is used to provide and/or fabricate one or more interconnects (e.g., traces, vias, pads) in/on a substrate.

FIG. 12 illustrates a detailed exemplary flow diagram for a semi-additive processing (SAP) patterning process for fabricating a substrate that includes interconnects. FIG. 12 will be described with reference to FIG. 13 which illustrates an exemplary sequence of a layer (e.g., core layer, prepreg layer) of a substrate during the SAP process of some implementations.

As shown in FIG. 12, the process 1200 may start by providing (at 1205) a dielectric layer that includes copper layer and a primer layer (e.g., a primer coated copper foil). In some implementations, the copper foil is coated with primer and then pressed on the uncured core to form the structure. The primer coated copper foil may be a copper foil. The dielectric layer may be a core layer or a prepreg layer of a substrate. As shown in stage 1 of FIG. 13, the primer 1304 is located between the copper foil 1306 and the dielectric 1302. The copper foil 1306 may be a copper composite foil in some implementations.

Next, the process drills (at 1210) the dielectric layer (e.g., core layer, prepreg layer) to create one or more openings/ pattern features (e.g., via pattern features). This may be done to form one or more vias/via features that connect the front and back side of the dielectric. In some implementations, the drilling may be performed by a laser drilling operation. Moreover, in some implementations, the drilling may traverse one or more the metal layers (e.g., primer coated copper foil). In some implementations, the process may also clean the openings/pattern features (e.g., via patterns) created by the drilling operation, by, for example, de-smearing (at 1212) drilled vias/opening on the layer (e.g., core layer).

The process then etches off (at 1215) the copper foil, leaving the primer on the dielectric layer (which is shown in stage 2 of FIG. 13). Next, the process electroless plates (at 1220) a copper seed layer (e.g., copper material) on the primer in some implementations. The thickness of the copper seed layer in some implementations is about 0.1-1 microns (μm). Stage 3 of FIG. 13 illustrates a copper seed layer 1308 on the primer 1304.

Next, the process applies (at 1225) a dry film resist (DFR) and a pattern is created (at 1230) on the DFR. Stage 4 of FIG. 13 illustrates a DFR 1310 being applied on top of the copper seed layer 1308, while stage 5 of FIG. 13 illustrates the patterning of the DFR 1310. As shown in stage 5, the patterning creates openings 1312 in the DFR 1310.

After patterning (at 1230) the DFR, the process then electrolytically plates (at 1235) a copper material (e.g., copper composite material) through the pattern of the DFR. In some implementations, electrolytically plating comprises dipping the dielectric and the metal layer in a bath solution. Referring to FIG. 13, stage 6 illustrates copper materials 1320 (e.g., copper composite material) being plated in the openings 1312 of the DFR 1310.

Referring back to FIG. 12, the process removes (at 1240) the DFR, selectively etches (at 1245) the copper seed layer to isolate the features (e.g., create vias, traces, pads) and ends. Referring to FIG. 13, Stage 7 illustrates the removal of the DFR 1310, while Stage 8 illustrates the defined features (e.g., composite conductive trace) after the etching process.

The above process of FIG. 12 may be repeated for each core layer or prepreg layer (dielectric layer) of the substrate.

In some implementations, the SAP process may allow for finer/smaller feature (e.g., trace, vias, pads) formation since the SAP process does not require as much etching to isolate features. In some implementations, the above process may be used for produce Interstitial Via Hole (IVH) in substrates and/or Blind Via Hole (BVH) in substrates.

Exemplary Package Substrate that Includes an Electroless Metal Layer

In some implementations, a package substrate may include at least one solder resist layer (e.g., solder resist mask). FIG. 14 conceptually illustrates an example a package substrate that includes surface interconnects and a cavity that includes an electroless fill and a solder resist layer. Specifically, FIG. 14 illustrates a package substrate 1400 that includes a first dielectric layer 1402, a first pad 1404, a via 1406, a second pad 1408, a first interconnect 1410, a second interconnect 1412, a first cavity 1420, a third interconnect 1422, a first solder resist layer 1440, and a second resist layer 1442. The first dielectric layer 1402 has a first surface (e.g., top surface) and a second surface (e.g., bottom surface). The first surface is opposite to the second surface. Different implementations may use different materials for the first dielectric layer 1402. In some implementations, the first dielectric layer 1402 may be a substrate.

The first pad 1404 is located on the first surface of the substrate 1402. In some implementations, the first pad 1404 includes a first metal layer 1403 and a second metal layer 1405. In some implementations, the first metal layer 1403 is a seed layer. In some implementations, the first metal layer 1403 is an electroless fill layer (e.g., electroless metal layer). The via 1406 traverses the first dielectric layer 1402. In some implementations, the via 1406 includes a first metal layer 1407 and a second metal layer 1409. In some implementations, the first metal layer 1407 is a seed layer. In some implementations, the first metal layer 1407 is an electroless fill layer (e.g., electroless metal layer).

The first pad 1404 is coupled to a first portion (e.g., top portion, top surface) of the via 1406. The second pad 1408 is embedded in the second surface of the first dielectric layer 1402. The second pad 1408 is coupled to a second portion (e.g., bottom portion, bottom surface) of the via 1406. Different implementations may use different materials for the first pad 1404, the via 1406, and the second pad 1408. In some implementations, the first pad 1404, the via 1406, and the second pad 1408 includes a metal layer (e.g., copper layer).

The first interconnect 1410 is on the first surface of the first dielectric layer 1402. In some implementations, the first interconnect 1410 is a trace on the first surface of the first dielectric layer 1402. In some implementations, the first interconnect 1410 includes a first metal layer 1411 and a second metal layer 1413. In some implementations, the first metal layer 1411 is a seed layer. In some implementations, the first metal layer 1411 is an electroless fill layer (e.g., electroless metal layer)

The second interconnect 1412 is embedded in the second surface of the first dielectric layer 1402. In some implementations, the second interconnect 1412 is a trace embedded in the second surface of the first dielectric layer 1402. Different implementations may use different materials for the first and second interconnects 1410 and 1412. In some implementations, the first and second interconnects 1410 and 1412 include a metal layer (e.g., copper layer).

FIG. 14 also illustrates that the cavity 1420 traverses the first surface of the first dielectric layer 1402. Different implementations may use different process for fabricating the cavity 1420 in the first dielectric layer 1402. In some implementations, the cavity 1420 partially traverses the first dielectric layer 1402 through the first surface of the first dielectric layer 1402. In some implementations, the cavity 1420 is at least partially filled with the third interconnect 1422. In some implementations, the third interconnect 1422 is a trace that is made of an electroless fill. In some implementations, the electroless fill is an electroless metal layer (e.g., electroless copper layer).

In some implementations, the third interconnect 1422 is a high density and/or fine pitch interconnects that electrically couple two dies on the package substrate. An example of interconnects that may electrically couple two dies was further described in FIG. 7. In some implementations, the spacing between two adjacent interconnects (e.g., traces) is about 5 microns (μm) or less. In some implementations, the spacing between two adjacent interconnects (e.g., traces) is about 3 microns (μm) or less.

In some implementations, the third interconnect 1422 is made of a different material than the first interconnect 1410 and/or the second interconnect 1412. For example, the third interconnect 1422 includes an electroless metal layer, and the first interconnect 1410 and/or the second interconnect 1412 includes a metal layer.

As shown in FIG. 14, the first solder resist layer 1440 is located on the first surface (e.g., top surface) of the first dielectric layer 1402. In some implementations, the first solder resist layer 1440 may also be in the cavity 1420. The second solder resist layer 1442 is located on the second surface (e.g., bottom surface) of the first dielectric 1402. FIG. 14 illustrates a package substrate without a core layer. However, in some implementations, a package substrate may include a core layer.

FIG. 15 conceptually illustrates an example of a package substrate that includes a core layer, surface interconnects and a cavity that includes an electroless fill and a solder resist layer. Specifically, FIG. 15 illustrates a package substrate 1500 that includes a core layer 1502, a first dielectric layer 1504, a second dielectric layer 1506, a first pad 1510, a first via 1512, a second pad 1514, a second via 1516, a third pad 1518, a third via 1520, and a fourth pad 1522. The package substrate 1500 also includes a first interconnect 1524, a cavity 1530, a second interconnect 1532, a first solder resist layer 1540, and a second solder resist layer 1542.

The core layer 1502 has a first surface (e.g., top surface) and a second surface (e.g., bottom surface). The first surface is opposite to the second surface. Different implementations may use different materials for the core layer 1502. In some implementations, the core layer 1502 may be made of at least one of a dielectric layer. The first dielectric layer 1504 is coupled to the first surface of the core layer 1502. The second dielectric layer 1506 is coupled to the second surface of the core layer 1502. In some implementations, the first dielectric layer 1504 and the second dielectric layer 1506 are prepeg dielectric layers.

The first pad 1510 is located on a first surface (e.g., top surface) of the first dielectric layer 1504. In some implementations, the first pad 1510 includes a first metal layer 1511 and a second metal layer 1513. In some implementations, the first metal layer 1511 is a seed layer. In some implementations, the first metal layer 1511 is an electroless fill layer (e.g., electroless metal layer). The first via 1512 traverses the first dielectric layer 1504. The first pad 1510 is coupled to a first portion (e.g., top portion, top surface) of the first via 1512. In some implementations, the first via 1512 includes a first metal layer 1515 and a second metal layer 1517. In some implementations, the first metal layer 1515 is a seed layer. In some implementations, the first metal layer 1515 is an electroless fill layer (e.g., electroless metal layer). The second pad 1514 is embedded in a second surface (e.g., bottom surface) of the first dielectric layer 1504. The second pad 1514 is coupled to a second portion (e.g., bottom portion, bottom surface) of the first via 1512.

The second via 1516 traverses the core layer 1502. The second pad 1514 is coupled to a first portion (e.g., top portion, top surface) of the second via 1516. The second pad 1514 is on the first surface of the core layer 1502. The third pad 1518 is coupled to a second portion (e.g., bottom portion, bottom surface) of the second via 1516.

The third pad 1518 is on the second surface (e.g., bottom surface) of the core layer 1502. The third pad 1518 is embedded in a first surface of the second dielectric layer 1506. The third via 1520 traverses the second dielectric layer 1506. The third pad 1518 is coupled to a first portion (e.g., top portion, top surface) of the third via 1520. The fourth pad 1522 is on a second surface (e.g., bottom surface) of the second dielectric layer 1506. The fourth pad 1522 is coupled to a second portion (e.g., bottom portion, bottom surface) of the third via 1520. In some implementations, the third via 1520 includes a first metal layer 1521 and a second metal layer 1523. In some implementations, the first metal layer 1521 is a seed layer. In some implementations, the first metal layer 1521 is an electroless fill layer (e.g., electroless metal layer).

Different implementations may use different materials for the first pad 1510, the first via 1512, the second pad 1514, the second via 1516, the third pad 1518, the third via 1520, and the fourth pad 1522. In some implementations, the first pad 1510, the first via 1512, the second pad 1514, the second via 1516, the third pad 1518, the third via 1520, and the fourth pad 1522 includes a metal layer (e.g., copper layer).

The first interconnect 1524 is on the first surface of the first dielectric layer 1504. In some implementations, the first interconnect 1524 is a trace on the first surface of the first dielectric layer 1502. Different implementations may use different materials for the first interconnect 1524. In some implementations, the first interconnect 1524 include a metal layer (e.g., copper layer). In some implementations, the first interconnect 1524 includes a first metal layer 1525 and a second metal layer 1527. In some implementations, the first metal layer 1525 is a seed layer. In some implementations, the first metal layer 1527 is an electroless fill layer (e.g., electroless metal layer).

FIG. 15 also illustrates that the cavity 1530 traverses the first surface of the first dielectric layer 1504. Different implementations may use different process for fabricating the cavity 1530 in the first dielectric layer 1504. In some implementations, the cavity 1530 partially traverses the first dielectric layer 1504 through the first surface of the first dielectric layer 1504. In some implementations, the cavity 1530 is at least partially filled with the second interconnect 1532. In some implementations, the second interconnect 1532 is a trace that is made of an electroless fill. In some implementations, the electroless fill is an electroless metal layer (e.g., electroless copper layer).

As shown in FIG. 15, the first solder resist layer 1540 is located on the first surface (e.g., top surface) of the first dielectric layer 1504. In some implementations, the first solder resist layer 1540 may also be in the cavity 1530. The second solder resist layer 1542 is located on the first surface (e.g., bottom surface) of the second dielectric 1506.

In some implementations, the second interconnect 1532 is a high density and/or fine pitch interconnects that electrically couple two dies on the package substrate. An example of interconnects that may electrically couple two dies was further described in FIG. 7. In some implementations, the spacing between two adjacent interconnects 1532 (e.g., traces) is about 5 microns (µm) or less. In some implementations, the spacing between two adjacent interconnects (e.g., traces) is about 3 microns (µm) or less.

In some implementations, the second interconnect 1532 is made of a different material than the first interconnect 1524. For example, the second interconnect 1532 includes an electroless metal layer, and the first interconnect 1524 includes a metal layer.

Exemplary Electronic Devices

FIG. 16 illustrates various electronic devices that may be integrated with any of the aforementioned integrated device, semiconductor device, substrate, package substrate, integrated circuit, die, interposer or package. For example, a mobile telephone 1602, a laptop computer 1604, and a fixed location terminal 1606 may include an integrated circuit (IC) 1600 as described herein. The IC 1600 may be, for example, any of the integrated circuits, integrated devices, dies, substrates or packages described herein. The devices 1602, 1604, 1606 illustrated in FIG. 16 are merely exemplary. Other electronic devices may also feature the IC 1600 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 3, 4, 5, 6, 7, 8A-8C, 9, 10A-10B, 11, 12, 13, 14, 15 and/or 16 may be rearranged and/or combined into a single component, step, feature or function or embodied in several components, steps, or functions. Additional elements, components, steps, and/or functions may also be added without departing from the disclosure. It should also be noted that FIGS. 3, 4, 5, 6, 7, 8A-8C, 9, 10A-10B, 11, 12, 13, 14, 15 and/or 16 and its corresponding description in the present disclosure is not limited to dies and/or ICs. In some implementations, FIGS. 3, 4, 5, 6, 7, 8A-8C, 9, 10A-10B, 11, 12, 13, 14, 15 and/or 16 and its corresponding description may be used to manufacture, create, provide, and/or produce integrated devices. In some an integrated device may include a die package, substrate, package substrate, an integrated circuit (IC), a wafer, a semiconductor device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A substrate comprising:
   a first dielectric layer comprising a first surface and a second surface;
   a first interconnect on the first surface of the first dielectric layer, wherein the first interconnect has a first metal layer and a second metal layer over the first metal layer, wherein the second metal layer is thicker than the first metal layer; and
   a second interconnect embedded in a first trench in the first surface of the first dielectric layer, the first trench is at least partially filled with the first metal layer and has an absence of the second metal layer over the first metal layer.

2. The substrate of claim 1, further comprising:
   a first pad on the first surface of the first dielectric layer;
   a first via traversing the first dielectric layer, the first via coupled to the first pad; and
   a second pad embedded in the first dielectric layer, the second pad embedded through the second surface of the first dielectric layer, wherein the second pad is coupled to the first via.

3. The substrate of claim 1, further comprising a core layer comprising a first surface and a second surface, wherein the first surface of the core layer is coupled to the second surface of the first dielectric layer.

4. The substrate of claim 3, wherein the core layer comprises a first via, and the first via includes a first metal layer and a second metal layer over the first metal layer and further wherein the first metal layer is formed on sidewalls of the first via.

5. The substrate of claim 3, further comprising a second dielectric layer comprising a first surface and a second surface, wherein the first surface of the second dielectric layer is coupled to the second surface of the core layer.

6. The substrate of claim 1, further comprising:
a first pad on the first surface of the first dielectric layer, the first pad coupled to the second interconnect.

7. The substrate of claim 1, wherein the substrate is one of at least a package substrate and/or an interposer.

8. The substrate of claim 1, wherein the substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

9. The substrate of claim 1, wherein the first metal layer is a seed layer and is distinct from the second metal layer.

10. The substrate of claim 1, wherein the first metal layer is an electroless fill layer and is distinct from the second metal layer.

11. The substrate of claim 1, wherein the first metal layer includes a distinct metal composition than the second metal layer.

12. The substrate of claim 1, wherein the first interconnect is in contact with and above the first surface of the first dielectric layer.

13. The substrate of claim 1, wherein the second interconnect is fully below the first surface of the first dielectric layer.

14. The substrate of claim 1, wherein the first interconnect and the second interconnect are traces, and the second interconnect is narrower than the first interconnect.

15. A substrate comprising:
a first dielectric layer comprising a first surface and a second surface;
a first interconnect on the first surface of the first dielectric layer, wherein the first interconnect has an electroless metal layer and an electrolytic metal layer over the electroless metal layer; and
a second interconnect embedded in a first trench in the first surface of the first dielectric layer, the first trench is at least partially filled with the electroless metal layer and has an absence of the electrolytic metal layer over the electroless metal layer; and
further comprising a resist layer on the first dielectric layer, in the first trench, and over the electroless metal layer.

16. A substrate comprising:
a first dielectric layer comprising a first surface and a second surface;
a first interconnect on the first surface of the first dielectric layer, wherein the first interconnect has an electroless metal layer and an electrolytic metal layer over the electroless metal layer; and
a second interconnect embedded in a first trench in the first surface of the first dielectric layer, the first trench is at least partially filled with the electroless metal layer and has an absence of the electrolytic metal layer over the electroless metal layer; further comprising:
a third interconnect, adjacent to the second interconnect and embedded in a second trench in the first surface of the first dielectric layer, the second trench is at least partially filled with the electroless metal layer and has an absence of the electrolytic metal layer over the electroless metal layer, wherein a spacing between the second interconnect and the third interconnect is 3 microns (µm) or less.

* * * * *